US006532122B1

(12) United States Patent
Sugawara et al.

(10) Patent No.: US 6,532,122 B1
(45) Date of Patent: Mar. 11, 2003

(54) DATA STORAGE APPARATUS AND MAGNETIC RECORDING METHOD

(75) Inventors: Takao Sugawara, Kawasaki (JP); Shin Tomimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/493,791

(22) Filed: Jan. 28, 2000

(30) Foreign Application Priority Data

Jul. 23, 1999 (JP) .......................................... 11-208913

(51) Int. Cl.7 ............................................... G11B 20/18

(52) U.S. Cl. .............................. 360/46; 360/65; 360/40

(58) Field of Search ............................. 360/46, 40, 49, 360/51, 65, 48

(56) References Cited

U.S. PATENT DOCUMENTS 6,122,120 A * 9/2000 Shimoda ...................... 360/46
6,198,587 B1 * 3/2001 Hayashi ....................... 360/65
6,393,598 B1 * 5/2002 Tsang et al. .................. 360/40

* cited by examiner

*Primary Examiner*—Regina N. Holder
*Assistant Examiner*—Varsha A. Kapadia
(74) *Attorney, Agent, or Firm*—Greer, Burns & Crain, Ltd.

(57) ABSTRACT

A data storage apparatus for magnetic recording and regeneration on a medium. Only in case of a dibit or Tri-bit code sequence in MTR codes having a restricted number of magnetic transition consecutive, a write unit records the interval of the magnetic transition on the medium with an extension of ΔT relative to the original magnetic transition interval. For the maximum likelihood detection after equalization of the medium read signals, a read unit adds to an expected value of the maximum likelihood detection an amplitude error ΔV arising from the extension record of the magnetic transition interval relative to the original magnetic transition interval. A parameter regulation unit regulates and sets ΔT and ΔV by use of test patterns.

19 Claims, 23 Drawing Sheets

PRIOR ART

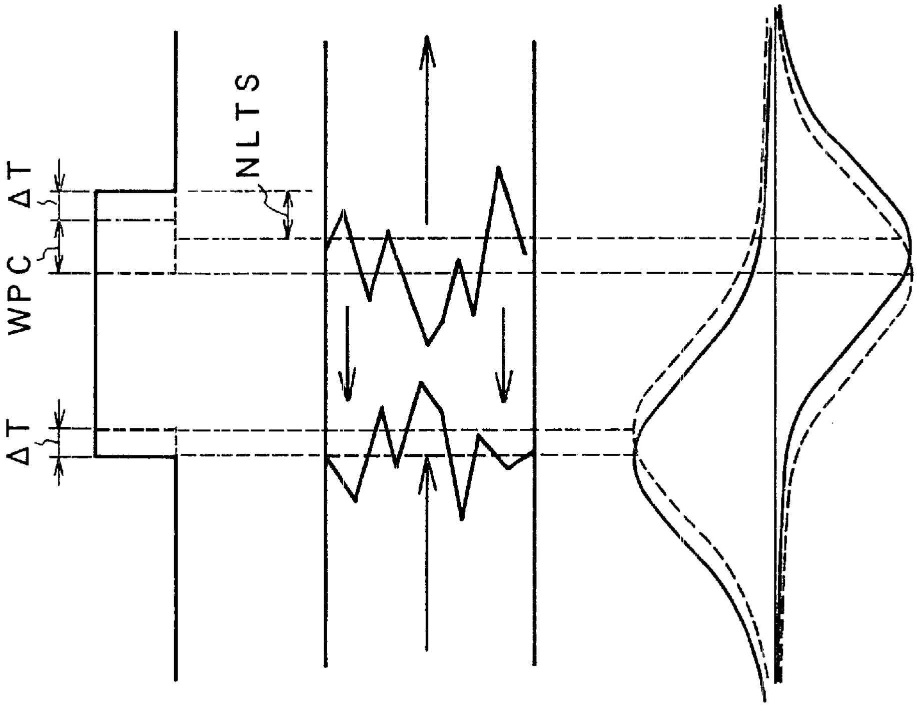
FIG. 9A WRITE CURRENT
FIG. 9B MAGNETIZATION
FIG. 9C HEAD OUTPUT SIGNAL

DATA STORAGE APPARATUS AND MAGNETIC RECORDING METHOD

BACKGROUND OF THE INVENTION

1. Field of the Invention

The present invention relates generally to a data storage apparatus for magnetic recording and regeneration, such as a hard disk drive, a magnetic tape apparatus and a magneto-optic recording apparatus, as well as a magnetic recording method and a recording method, and more particularly to a data storage apparatus ensuring an improved reliability of regenerative data by extension of magnetic transition intervals upon the recording on a medium.

2. Description of the Related Arts

A data magnetic recording system of the conventional hard disk drive has a configuration as depicted in FIG. 1 for example. The data magnetic recording system is constituted of a write unit 210 and a read unit 212. The write unit 210 comprises an encoder 216, a precoder 218 and a write driver 222, and serves to perform a magnetic recording of data on a magnetic disk by means of a head/medium 224. The read unit 212 comprises a preamplifier 226, a variable gain amplifier 228, a lowpass filter (LPF) 230, a sampler (analog-to-digital converter) 232, an equalizer 234, a Viterbi detector (maximum likelihood detector) 236, a decoder 238, a gain calculator 240, a phase calculator 242, a VFO 244 and a tap gain calculator 246. Data fed into the write unit 210 is subjected to any coding, typically RLL (Run Length Limited) coding, after which they pass through the precoder 218, with the write driver 222 feeding a write current of a rectangular waveform as indicated in FIG. 2A into the recording head to form a magnetic transition on a record medium in compliance with the codes. The direction of this write current determines the direction of fluxes on the medium as indicated in FIG. 2B, and the reversal of the write current corresponds to the magnetic transition. In the event of regenerating such fluxes on the medium by the read head, the head output signal may typically result in a signal having its peaks at the magnetic transition positions as indicated by broken lines in FIG. 2C. However, ISI (Inter-Symbol Interference) arising from the neighboring magnetic transitions gives rise to a signal as indicated by the solid line. The resultant head output signal is fed, through the preamplifier 226, the variable gain amplifier 228, the lowpass filter (LPF) 230 and the sampler 232, into the equalizer 234 which equalizes the signal into a desired waveform to thereby provide a waveform of the equalizer output signal as indicated in FIG. 2D. This equalizer output signal waveform corresponds to PR4 (partial response class 4) and is equalized so as to provide noise-free sampling values (expected values) equal to +1, 0 and −1 as indicated by circles. The sampling values pass through the Viterbi detector 236 for demodulating the recorded codes, with the resultant codes being finally decoded into original data in the decoder 238.

However, such a data magnetic recording system of the conventional hard disk drive entails problems which follow. FIGS. 3A to 3C illustrate the problems involved in the prior art. FIGS. 3A, 3B and 3C show the write current, the state of fluxes and the head output signal, respectively. First of all, with the increasing recording density there appear media noise or nonlinear phenomena, making it difficult to correctly demodulate into original data in spite of the equalization into a desired waveform as indicated in FIG. 2D by means of the equalizer 234. In the event of recording at the minimum magnetic transition intervals (code bit interval in case of RLL code d=0) in particular, there may remarkably occur phenomena such as nonlinear transition shift known as NLTS or partial erasures known as PE. For a countermeasure against the nonlinear transition shift NLTS, a correction is currently made by means of a write pre-compensation method called WPC. In general, the nonlinear transition shift NLTS is a phenomenon in which, in case of magnetic transition consecutive on the medium, the posterior magnetic transition position is forward shifted as indicated by an arrow 250 of FIG. 3B. Thus, the write pre-compensation WPC serves to cause the record current reversal position to shift backward to the solid line position as indicated by an arrow 252 so as to ensure the formation at the original magnetic transition position. Such a write pre-compensation WPC includes one capable of varying the amount of write compensation in response to the array of the magnetic transitions without being limited to the case of minimum magnetic transition intervals, although the similarity lies in that the posterior record current reversal position is shifted backward for the formation at the original magnetic transition position. The actual state of fluxes induced by such a write current may result in zigzagged magnetic transition positions as indicated in FIG. 3B, which has been considered as a major cause of the media noise. The partial erasure PE is a nonlinear amplitude reduction phenomenon which may occur in case the zigzagged magnetic transitions are enlarged and rightward fluxes are short-circuited at a part 154 so that no magnetic transition is formed. As a countermeasure against this partial flux PE it is similarly proposed to shift the write current reversal positions to extend the magnetic transition interval, thereby compensating the amplitude. It is therefore possible to effect a correction for the average value of the nonlinear transition shift NLTS or nonlinear distortions, by use of the method for shifting the magnetic transition positions.

However, those nonlinear distortions such as the nonlinear transition shift NLTS or the partial erasure PE are intrinsically stochastic phenomena, and it is envisaged that they are observed to be included in the media noise. Although this media noise increase with the increased recording density, no other measures than using the regenerative method having a larger S/N gain were found against the once-occurred medium noise dispersion. Furthermore, one of recent problems becoming more serious is a thermal relaxation phenomenon in which the recorded signals are degraded as a result of variations with time due to heat, whereupon it has been desired to record extended magnetic transition intervals. Thus, 1-7RLL code and 2-7RLL code free from any magnetic transition consecutive have also been given a consideration, although they have a poor code rate and involve characteristic problems or a problem that the clock frequency may inconveniently increase due to the wider bands.

SUMMARY OF THE INVENTION

According to the present invention there are provided a data storage apparatus, a magnetic recording method and a storage method capable of suppressing stochastic media noise of nonlinear phenomena such as nonlinear transition shift NLTS or a partial erasure PE and capable of improving the reliability of the regenerative data.

First, the present invention provides a data storage apparatus for magnetic recording and regeneration on a medium, the data storage apparatus comprising a write unit which, only in case of occurrence of a specific code sequence, records a magnetic transition interval on the medium with an extension relative to its original magnetic transition interval;

and a read unit which, in a maximum likelihood detection after equalization of read signals of the medium, adds to an expected value of the maximum likelihood detection an amplitude error arising from extension record of the magnetic transition interval relative to the original magnetic transition interval. Thus, by extending the magnetic transition interval of a specific code sequence, the present invention is able to suppress the media noise, the stochastic amount of dispersion of the non-linear phenomena such as the nonlinear transition shift NLTS or the partial erasure PE as small as possible, and is able to provide an improved reliability of the regenerative data. Also, the positive extension of the magnetic transition intervals contributes to a solution to the problems such as thermal relaxation. Furthermore, against the occurrence of any shifts of the regenerative signals from the ideal amplitude (sample value) as a result of the extended magnetic transition intervals, the degradation can be suppressed by the maximum likelihood detection through the addition of the shift-induced amplitude error to the expected value of the maximum likelihood detection.

The write unit, upon the magnetic recording on the medium, uses a coding scheme in which restriction is imposed on the magnetic transition consecutive occurring at the minimum interval, and the write unit, only in case of occurrence of a specific code sequence in the coding scheme, forms the magnetic transition interval on the medium with an extension relative to the original magnetic transition interval.

The write unit, upon the magnetic recording on the medium, uses MTR (Maximum Transition Run Trellis) codes whose magnetic transition consecutive occurring at the minimum interval has been restricted to two or less, and the write unit, only in case of occurrence of two consecutive magnetic transitions, records a first magnetic transition with a certain forward shift from its original position and a second magnetic transition with a certain backward shift from its original position. The write unit, upon the magnetic recording on the medium, uses MTR codes whose magnetic transition consecutive occurring at the minimum interval has been restricted to three or less. The write unit, in case of dibit, i.e., occurrence of two consecutive magnetic transitions, records a first magnetic transition with a certain forward shift from its original position and a second magnetic transition with a certain backward shift from its original position. The write unit, in case of Tri-bit, i.e., occurrence of three consecutive magnetic transitions, records a first magnetic transition with a certain forward shift from its original position, a second magnetic transition at its original position, and a third magnetic transition with a certain backward shift from its original position. By shifting the magnetic transition position backward, the write unit allows a combination of write pre-compensation WPC for compensating a forward shift of the nonlinear magnetic transition which may occur upon the recording.

Errors arising from the extension record of the magnetic transition intervals in the present invention may affect part of regenerating system for providing a feedback control using the regenerative signals. Thus, the read unit of the data storage apparatus in accordance with the present invention is provided with an equalizer for equalizing read signals of the medium into a desired signal waveform on the basis of an equalization error signal obtained from a difference between a pre-equalization signal and a post-equalization signal, and wherein if the read unit detects a specific code sequence recorded with certain shifts from its original magnetic transition positions, then the read unit does not use the equalization error signal at that time or does use the equalization error signal suppressed through a predetermined weighting. The read unit is provided with a PLL circuit for providing a phase control of sampling clock on the basis of a phase error signal obtained from a comparison between a reference clock and a clock extracted from an equalized regenerative signal, and wherein if the read unit detects a specific code sequence recorded with certain shifts from its original magnetic transition positions, then the read unit does not use the equalization error signal at that time or does use the equalization error signal suppressed through a predetermined weighting. The read unit is provided with an AGC circuit (gain calculator) for allowing a regenerative signal to have a desired amplitude on the basis of an amplitude error signal obtained from a comparison between an equalized regenerative signal and the desired amplitude, and wherein if the read unit detects a specific code sequence recorded with certain shifts from its original magnetic transition positions, then the read unit does not use the amplitude error signal at that time or does use the amplitude error signal suppressed through a predetermined weighting.

The data storage apparatus of the present invention further comprises a parameter regulation unit which monitors an error rate of a maximum likelihood detector through recording and regeneration of test patterns and which regulates and sets, so as to minimize the error rate, the amounts of magnetic transition extension ΔT of a specific code sequence for use in the write unit as well as the amounts of amplitude errors ΔV added to expected values in the maximum likelihood detection. The parameter regulation unit monitors an error rate acquired from a SAM (Sequenced Amplitude Margin) circuit by use of metric of the maximum likelihood detector, and regulates and sets each of the amounts of magnetic transition extension ΔT of a specific code sequence for use in the write unit as well as the amounts of amplitude errors ΔV added to the expected values in the maximum likelihood detection so as to minimize the error rate of the SAM. The SAM circuit ordinarily counts up the error if Mn is smaller than 0, that is, $$Mn<0$$

where Mn=(M1−M2), that is, Mn is a difference between the minimum metric M1 and the second minimum metric M2, among a plurality of metrics which are cumulative values of square errors acquired in the maximum likelihood detection. However, by adding any stress thereto, the SAM circuit may count up the error if $$Mn<K$$

where K is a value larger than 0, thereby compulsorily allowing a frequent occurrence of errors arising from noises, to make it possible to reduce the time taken to obtain the error rate to consequently achieve a high-speed processing of the parameter regulation.

The parameter regulation unit, previous to the regulation and setting of the amounts of magnetic transition extension ΔT upon the recording and the amounts of amplitude errors ΔV in the maximum likelihood detection, makes regulations of the amount of write pre-compensationWPC in the write unit, the cut-off frequency Fc and the amount of boost Fb of the filter provided in the read unit, and the tap gain Gtap of the equalizer. The parameter regulation unit, after the regulation by use of a two-bit consecutive magnetic transition pattern, makes regulations of the amounts of magnetic transition extension ΔT and the amounts of amplitude errors ΔV by use of a three-bit or more consecutive magnetic transition pattern.

The present invention further provides a magnetic recording method for magnetic recording and regeneration on a medium, comprising:

a recording step for, only in case of occurrence of a specific code sequence, recording a magnetic transition interval on the medium with an extension relative to its original magnetic transition interval; and a regenerating step for, in a maximum likelihood detection after equalization of read signals of the medium, adding an amplitude error arising from extension record of the magnetic transition interval relative to the original magnetic transition interval to an expected value of the maximum likelihood detection.

The details of this magnetic recording method are the same as those of the magnetic recording apparatus.

The present invention further provides a record method for magnetic recording on a medium, comprising the steps of, upon the magnetic recording on the medium, using a coding scheme in which magnetic transition consecutive occurring at the minimum interval has been restricted; and, only in case of occurrence of a specific code sequence in the coding scheme, recording a magnetic transition interval on the medium in such a manner that it becomes larger than its original magnetic transition interval.

The details of this recording method are the same as those of the write unit of the magnetic recording apparatus.

The above and other objects, aspects, features and advantages of the present invention will become more apparent from the following detailed description with reference to the accompanying drawings.

BRIEF DESCRIPTION OF THE DRAWINGS

FIGS. 9A to 9C are explanatory diagrams of the principle and the operation of extension record of magnetic transition intervals in the case of execution of the recording action of FIGS. 8A to 8C;

DETAILED DESCRIPTION OF THE PREFERRED EMBODIMENTS

Figure 4:
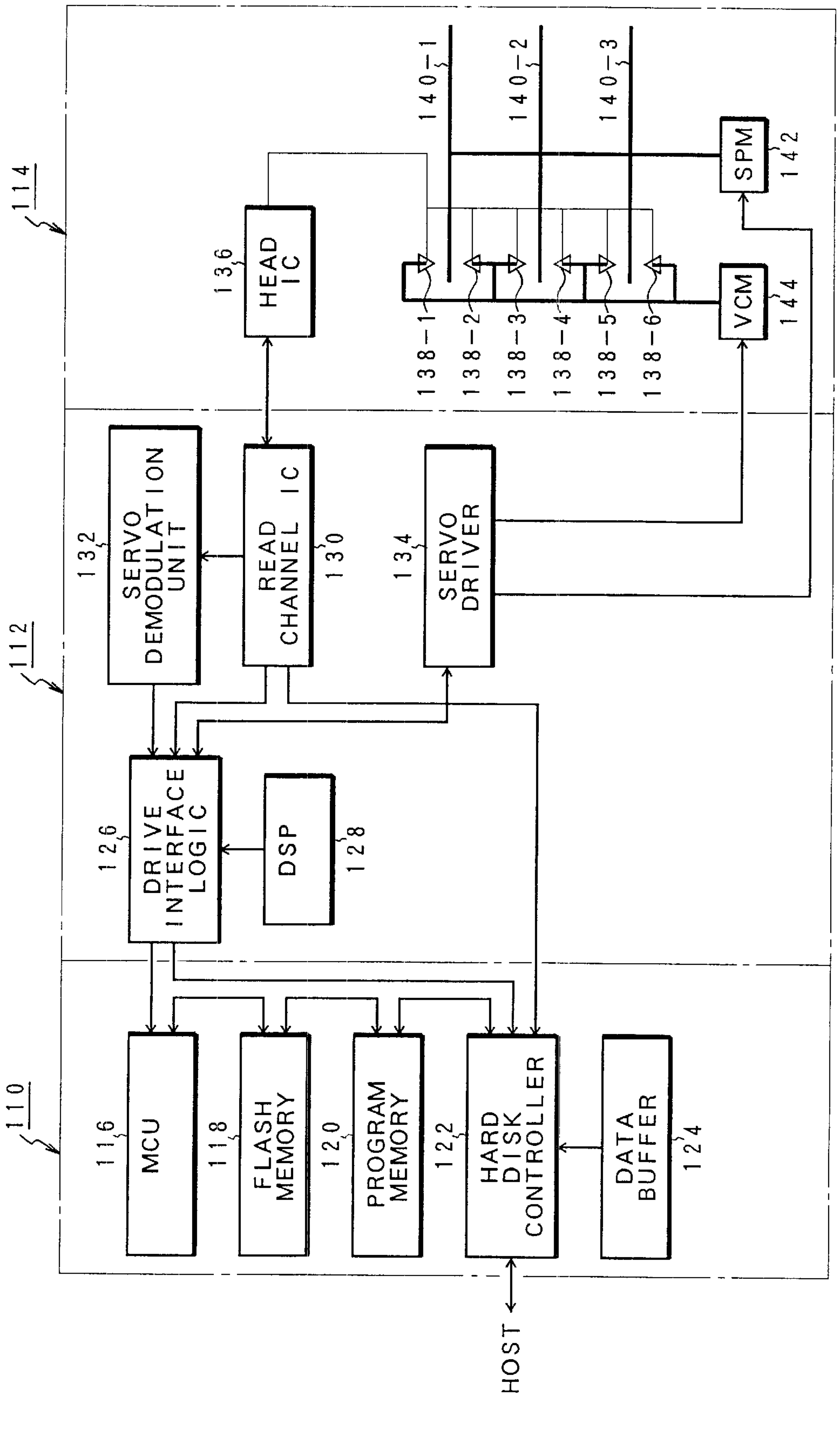
FIG. 4 is a block diagram of a hard disk drive to which the present invention is applied.

FIG. 4 is a block diagram of a hard disk drive to which the present invention is applied. The hard disk drive comprises an SCSI controller 110, a drive controller 112 and a disk enclosure 114. The SCSI controller includes an MCU 116, a flash memory 118 for use as a control storage, a program memory 120 for storing a control program, a hard disk controller 122 and a data buffer 124. The drive controller 112 includes a drive interface logic 126, a DSP 128, a read channel IC 130, a servo demodulation unit 132 and a servo driver 134. The disk enclosure 114 includes a head IC 136 which connects with combined heads 138-1 to 138-6 each having a write head and a read head. The combined heads 138-1 to 138-6 are associated with record surfaces on magnetic disks 140-1 to 140-3 and are positioned at any track sector locations of the disk media 140-1 to 140-3 through the drive by a VCM 144. The magnetic disks 140-1 to 140-3 are rotated at a certain speed by a spindle motor 142. A command issued from a host is stored in a command queue of the flash memory 118 by way of the hard disk controller 122. The MCU 116 fetches a command from the foremost location of the command queue of the flash memory 118, and, in case of a write command for example, uses the hard disk controller 122 in order to require the host to transfer write data. The write data transferred from the host are stored in the data buffer 124, and the MCU 116 activates the hard disk controller 122 to perform data writing onto the magnetic disks 140-1 to 140-3. At the same time, the DSP 128 provides a control of the head positioning by the VCM 144 relative to the sector locations imparted by the write command, on the basis of servo demodulation signals obtained via the servo driver 134 and the servo demodulation unit 132. The write data stored in the data buffer 24 are fed through the hard disk controller 122, the drive interface logic 126, a write channel (write unit) of the read channel IC 130, and the head IC 136, and are written for example from the combined head 138-1 onto a sector location of the magnetic disk 140-1 specified by the write command. After the completion of writing of the write data onto the magnetic disk, the MCU 116 reports a status indicative of the write normal end to the host by way of the hard disk controller 122. In case the host issues a read command, the read command is stored via the hard disk controller 122 into the command queue of the flash memory 118, after which the MCU 116 fetches the read command and reproduces data written at a sector location on the magnetic disk 140-1 specified by the read command, from for example the combined head 138-1 by way of the hard disk controller 122, the drive interface logic 126, a read channel (read unit) of the read channel IC 130 and the head IC 136. The MCU 116 transfers the thus reproduced data to the host by means of the hard disk controller 122.

Figure 5A:
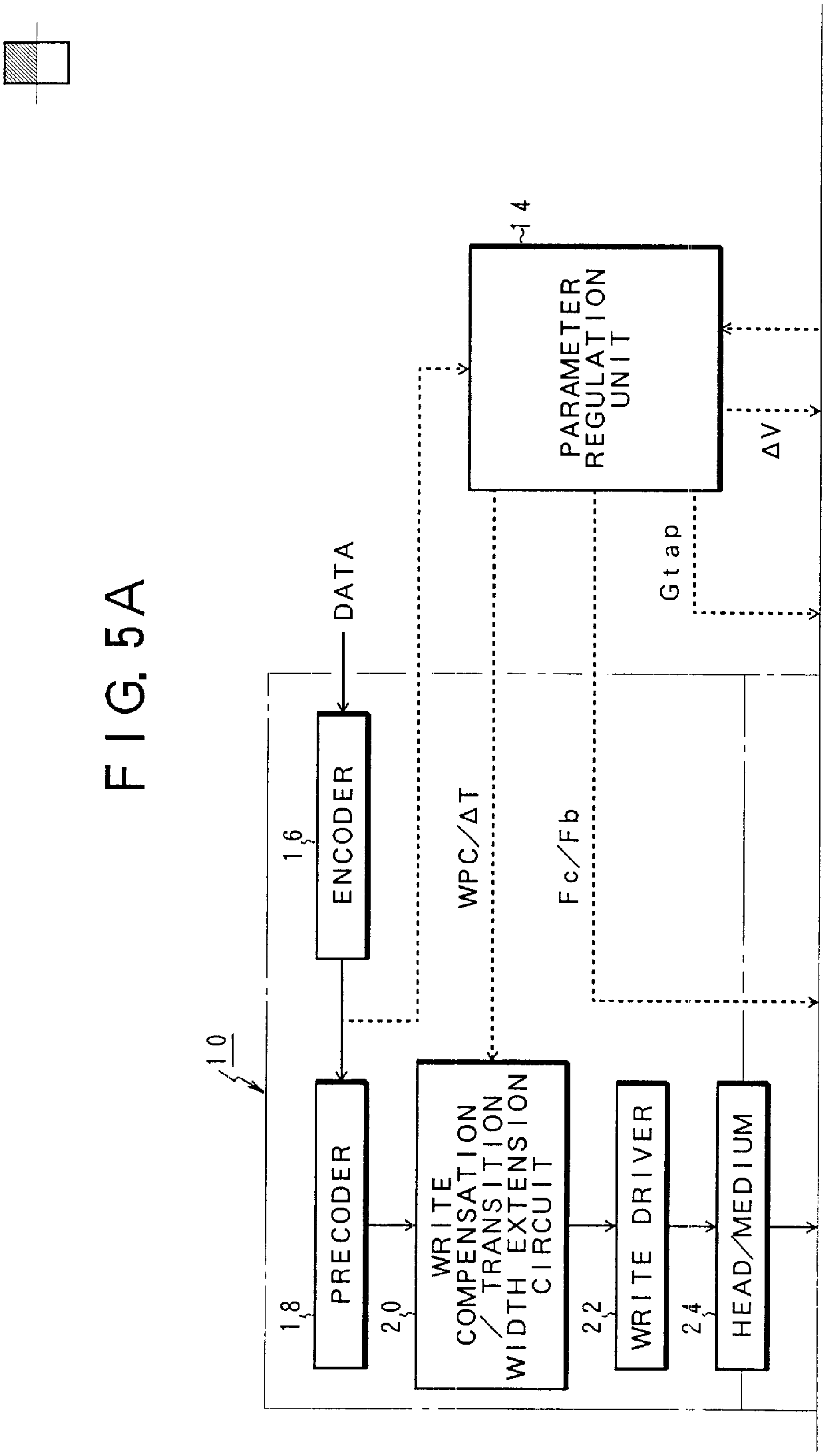
FIGS. 5A and 5B are block diagrams of an embodiment of the present invention.
Figure 5B:
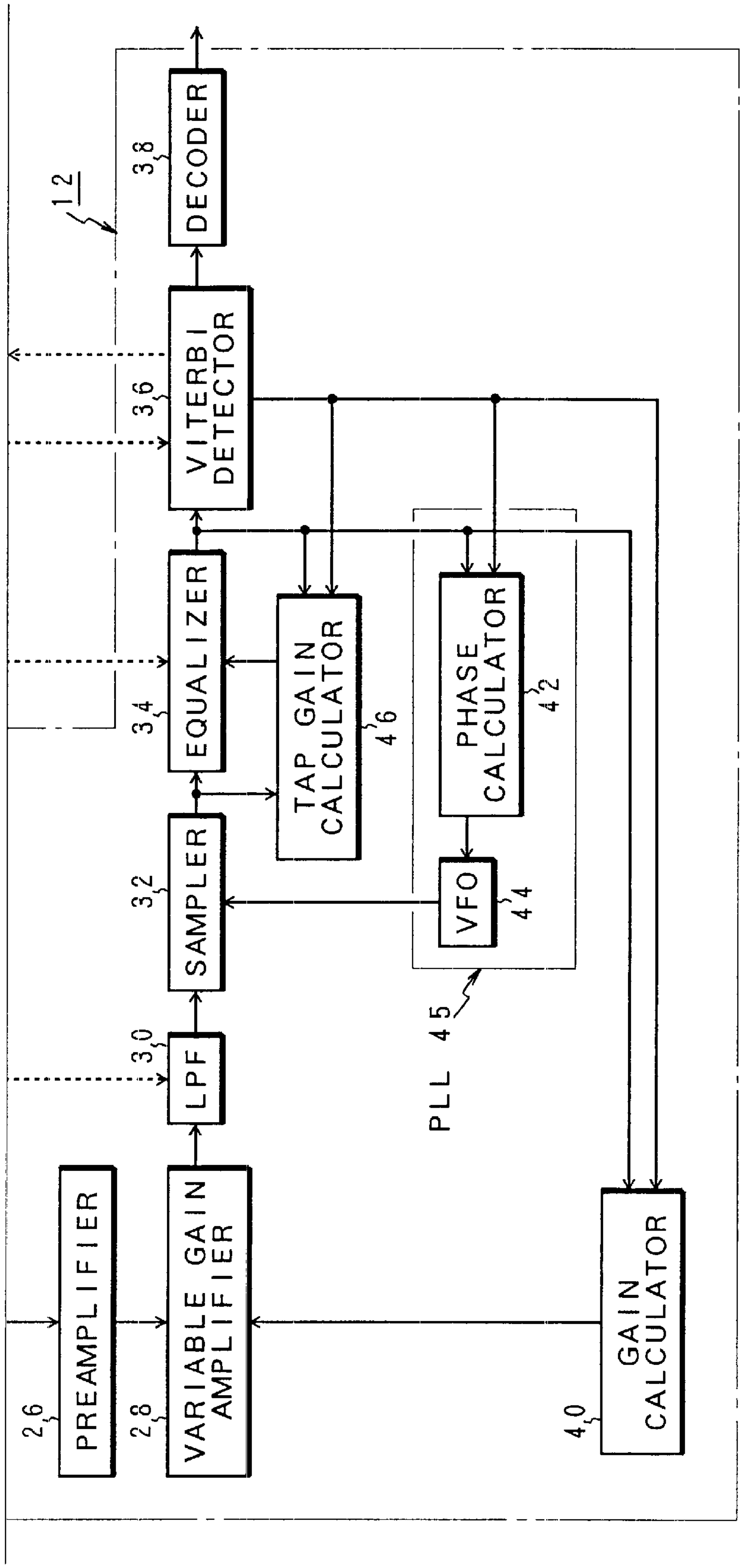

FIGS. 5A and 5B are block diagrams of a data magnetic recording system provided in the read channel IC of FIG. 4, having a minimum time transition width extension record function in accordance with the present invention. The data magnetic recording system is constituted of a write unit 10 and a read unit 12. The write unit 10 comprises an encoder 16, a precoder 18, a write pre copensation/transition width extension circuit 20 and a write driver 22. The write driver 22 is followed by a head/medium 24 which is a magnetic recording system consisting of a recording head, a magnetic disk and a regenerating head. The read unit 12 comprises a preamplifier 26, a variable gain amplifier 8, a lowpass filter 30, a sampler 32, an equalizer 34, a Viterbi detector 36 and a decoder 38. In order to provide a feedback control system, the variable gain amplifier 28 is associated with a gain calculator 40 having an AGC function, the sampler 32 is associated with a PLL circuit (timing recovery circuit) including a phase calculator 42 and a VFO 44, and the equalizer 34 is associated with a tap gain calculator 46. The data magnetic recording system of the present invention is characterized in that by virtue of the transition width extension function implemented by the write pre compensation/transition width extension circuit 20 provided in the write unit 10, the interval of magnetic transition on the medium are extended for recording more than the original magnetic transition interval only in the case of occurrence of a specific code sequence within the write data. As a result of such extended recording of the magnetic transition interval of the specific code sequence in the write unit 10, in the read unit 12 a regenerative signal by the magnetic transition interval extended recording involves an amplitude error relative to a regenerative signal by the original magnetic transition interval recording, so that the maximum likelihood detection is carried out by allowing an amplitude error ΔV produced in the magnetic transition interval extended recording to be involved in an expected value as an ideal sampling value free from any noise for use in the Viterbi detector 36. In this case, the object of the specific code sequence whose magnetic transition interval is to be extended for recording more than the original magnetic transition interval in the write unit 10 can be for example MTR code (Maximum Transition Run Trellis Code) which restricts a magnetic transition consecutive which may occur at the minimum interval. The MTR code was proposed by Professor Moon in University of Minnesota in 1996 (J. Moon and B. Brickner "Maximal transition run codes for data storage system", IEEE Trans, on Magnetics, Vol. 32, No. 5, pp. 3992–3994, September, 1996).

The MTR code can include two codes which follow for example:

I. Dibit MTR code whose magnetic transition consecutive occurring at the minimum distance has been limited to two (dibit) or less; and II. Tribit MTR code whose magnetic transition consecutive occurring at the minimum distance has been limited to three (Tri-bit) or less.

These MTR codes are used in combination with PR4ML, EPR4ML, EEPR4ML in the maximum likelihood detection of the partial response. Herein, PR4ML has an equalization characteristic of (1+D) providing an equalization that the noise-free sample value is +1, 0, −1. EPR4 ML has an equalization characteristic of $(1+D)^2$ providing an equalization that the noise-free sample value is +1, +1, −1, −1. Furthermore, EEPR4ML has an equalization characteristic of $(1+D)^3$ providing an equalization that the noise-free sample value is +1, +2, 0, −2, −1.

Figures 6A, 6B, 6C:
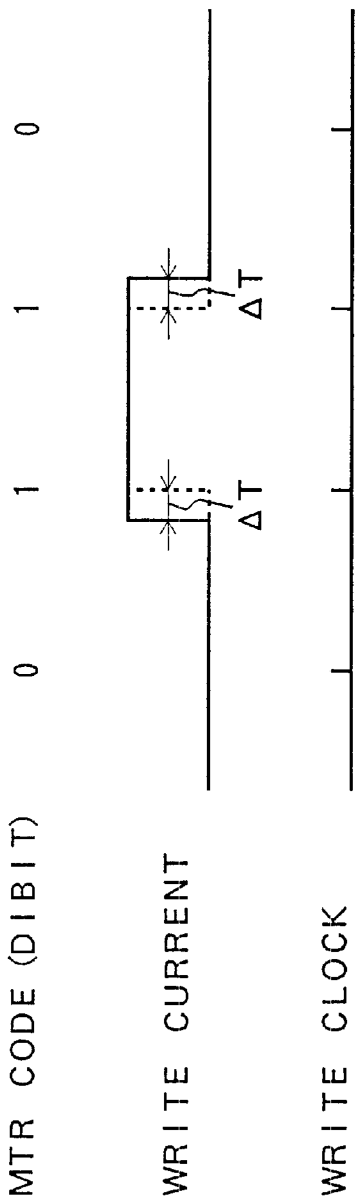
FIGS. 6A to 6C are explanatory diagrams of a recording action of a dibit in accordance with the present invention, of an MTR code whose magnetic transition consecutive has been limited to two or less.

FIGS. 6A to 6C illustrate a dibit MTR code which is applied to the present invention, showing an MTR code "0110" upon the record with the minimum magnetic transition consecutive being two (dibit), a write current thereof and a write clock. With respect to the rise and fall positions of the write current achieving the original magnetic transitions indicated by broken lines, in the case of this dibit MTR code "0110", the first bit 1 based magnetic transition position is shifted for recording by an extension width ΔT forward from the original rise position indicated by the broken line, and the second bit 1 based magnetic transition position is shifted for recording by the extension width ΔT backward from the original fall position indicated by the broken line.

Figures 7A, 7B, 7C:
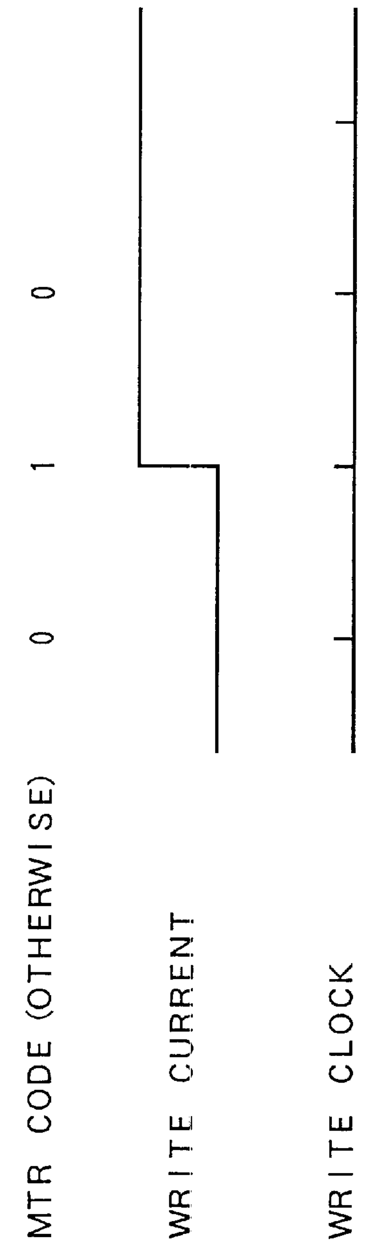
FIGS. 7A to 7C are explanatory diagrams of a recording action of bits except dibit, of the MTR code whose magnetic transition consecutive has been limited to two or less.

FIGS. 7A to 7C illustrate an MTR code write current and a write clock in the case where the consecutive of magnetic transition occurring at the minimum interval is less than two in the dibit MTR code, for the MTR code "010" by way of example. In this case the extension of the magnetic transition position is not carried out.

Figures 8A, 8B, 8C:
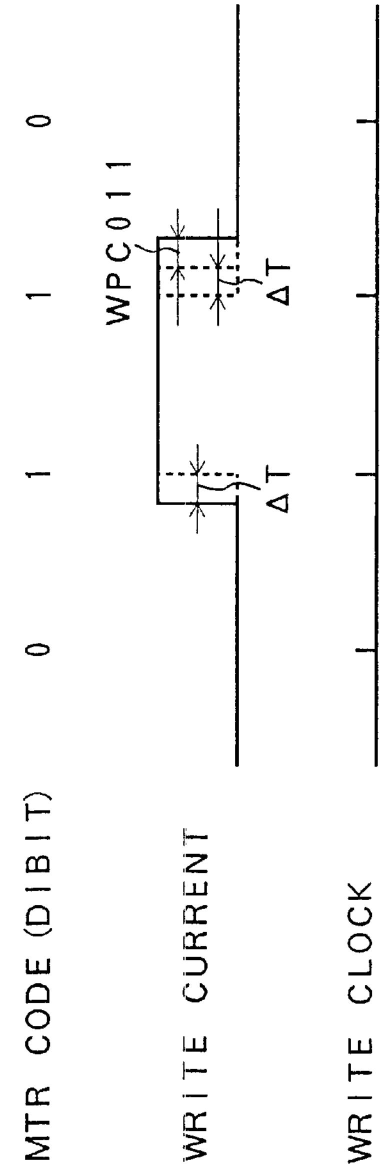
FIGS. 8A to 8C are explanatory diagrams of a recording action when a write pre-compensation has further been added to the recording action of FIGS. 6A to 6B.

FIGS. 8A to 8C illustrate an MTR code write current and a write clock in which the magnetic transition extension record in accordance with the present invention is combined with a write pre-compensation WPC for correcting nonlinear transition shift NLTS in the case of two consecutive bits 1 resulting in the magnetic transition of the dibit MTR code "0110" of FIGS. 6A to 6C. That is, the extension of the magnetic transition position allows the first bit 1 to be shifted forward by the extension width ΔT and it allows the second bit 1 to be shifted backward by the extension width ΔT. In addition to this, the second bit 1 is further shifted backward by the amount of the write pre-compensation WPC011 in order to correct the nonlinear transition shift NLTS.

FIGS. 9A to 9C illustrate a write current, a flux state and a head output signal in the case of two consecutive minimum magnetic transition intervals of the dibit MTR code. The principle of the present invention will be described with reference to FIGS. 9A to 9C. In the present invention, upon the recording as shown in FIG. 9A the reversal interval between the write current rise and fall corresponding to two consecutive bits 1 indicated by broken lines are shifted forward and backward by the extension width ΔT so as to extend the interval as indicated by the solid lines, whereby this record current allows a record of the minimum magnetic transition interval in the magnetization recorded on the medium as in FIG. 9B. In FIG. 9A, to correct the forward shift of the magnetic transition by the non-linear transition shift NLTS, the position of the posterior bit 1 is extended backward (delayed) by the amount of write pre-compensation WPC, in addition to the extension of the minimum magnetic transition interval by the present invention. Two differences lie between the extension of the minimum magnetic transition interval of the present invention and the write pre-compensation WPC for the non-linear transition shift NLTS. The first difference lies in that the write pre-compensation WPC extends the reversal interval of the write current but aims to make the formed magnetic transition interval into original interval. The second difference lies in that the write pre-compensation WPC intends to delay the posterior reversal position in case of consecutive write current reversals, but does not act on the anterior transition position with no forward shift time-sequentially. Furthermore, already proposed compensation for partial erasure PE is similar in that the interval of the magnetic transition is extended for recording, but differs in that the PE compensation is a compensation for recovering the average value of the regenerated signal amplitude to the ideal amplitude in the absence of PE and that it does not take into consideration the improvement in SN ratio in view of the variance of the medium noise as in the extension record of the minimum magnetic transition interval of the present invention. The present invention is greatly characterized in that it aims to suppress any increase in the medium noise and to perform positive extension of the magnetic transition interval. In the event that the magnetic transition interval is extended for the suppression of increase in the medium noise in this manner, the equalization waveform upon the regeneration may shift from the ideal amplitude sample values. Thus, the present invention allows the Viterbi detector 36 provided in the read unit 12 of FIG. 5 to involve as the ideal sample values the amplitude errors generated by the extension record of the minimum magnetic transition interval, thereby suppressing any deterioration.

Figures 10A, 10B, 10C:
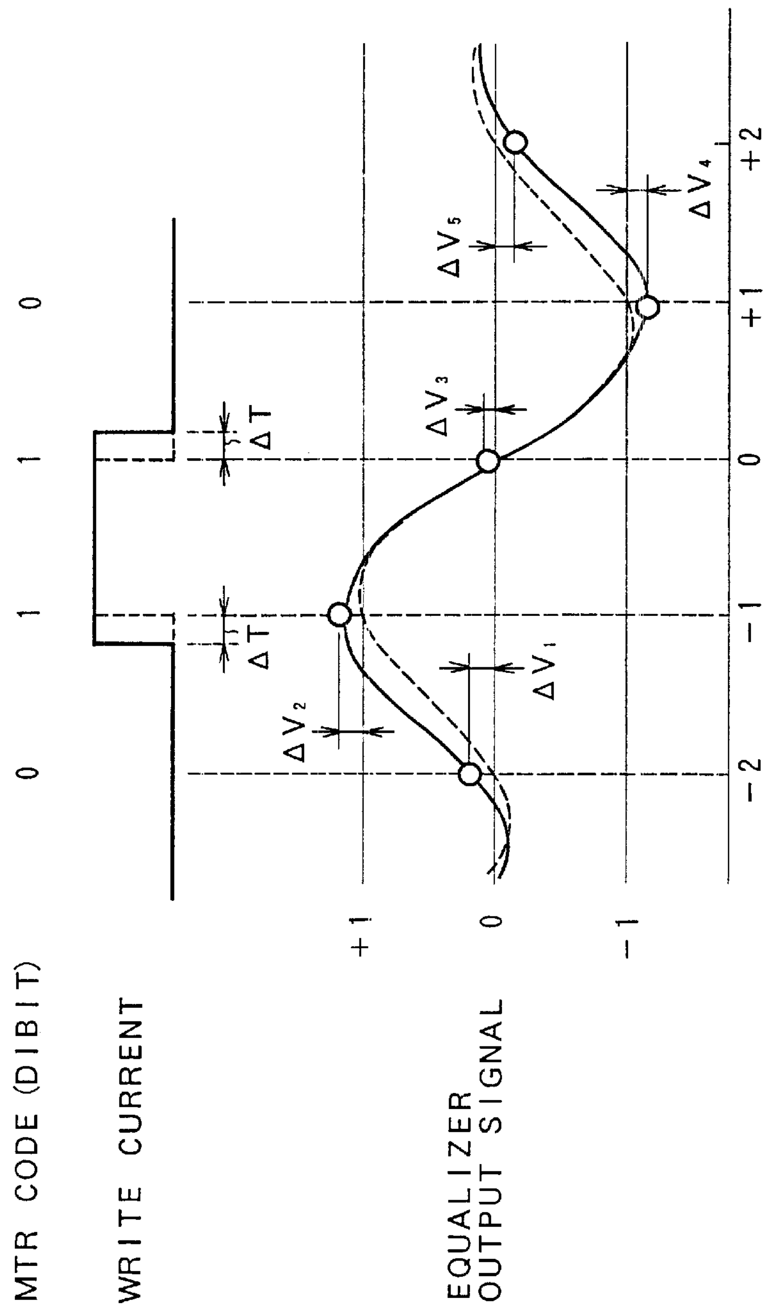
FIGS. 10A to 10C are explanatory diagrams of errors which may occur in the maximum likelihood detection as a result of the magnetic transition interval extension record in the present invention.

FIGS. 10A to 10C illustrate a write current of a dibit MTR code sequence "0110" having two consecutive magnetic transitions, and an equalizer output signal from the regeneration unit, obtained as a result of regeneration of the magnetic transition interval extension record by this write current. In the event of recording the magnetic transition interval by the write current with the extension relative to the original one in this manner, the equalizer output signals do not result in the ideal sample values as indicated by a broken line and involve errors ΔV1, ΔV2, ΔV3, ΔV4 and ΔV5 as indicated by circles on a solid line waveform. These errors ΔV1 to ΔV5 have different values depending on the array of the magnetic transition intervals, that is, on the record cord sequence. The present invention uses the Viterbi detector 36 described below to take into consideration the amplitude errors which may be involved in the equalizer output signals as a result of such extension record of the magnetic transition intervals.

Figure 1:
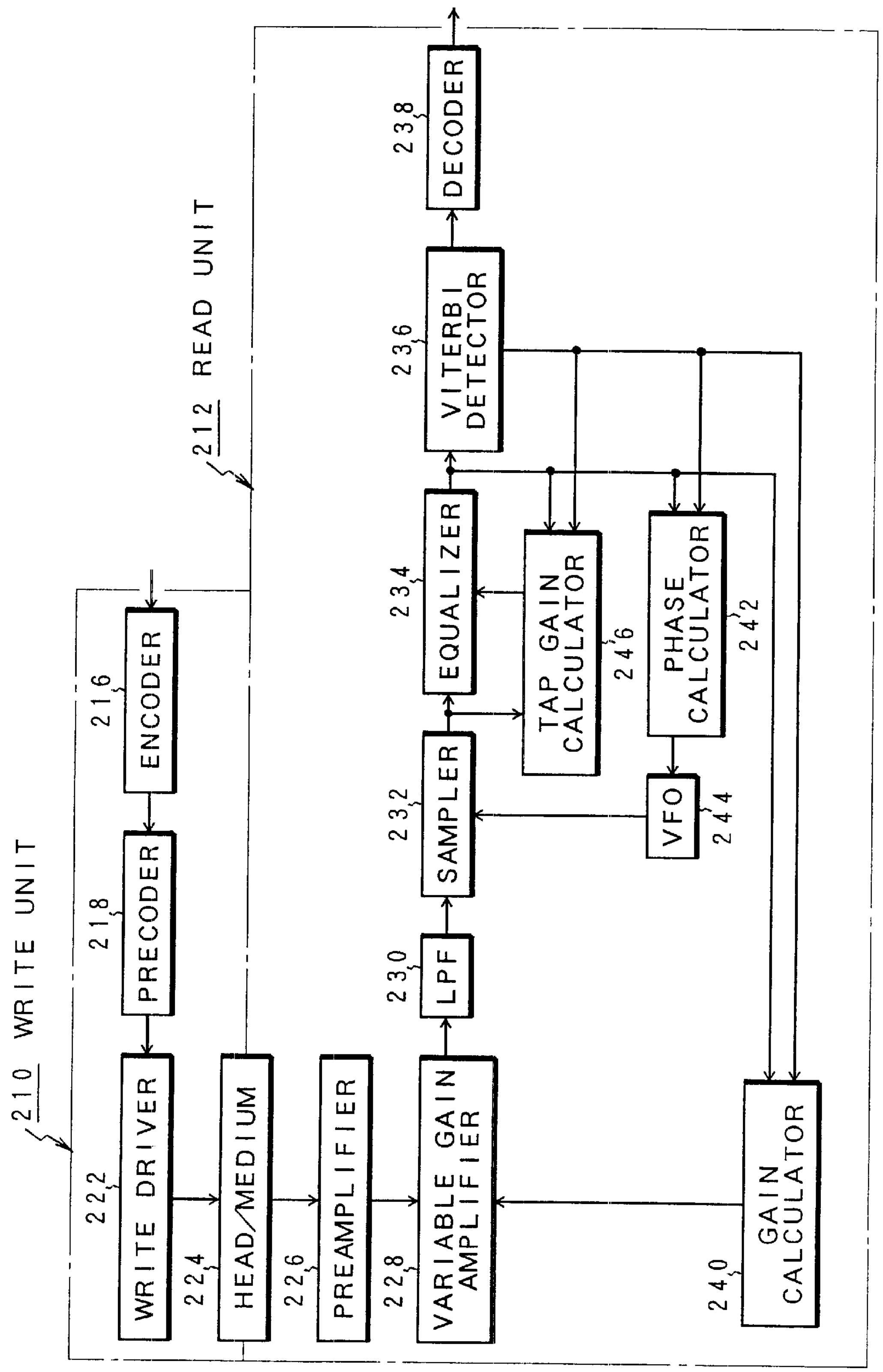
FIG. 1 is a block diagram of a data magnetic recording system in a conventional hard disk drive.
Figures 2A, 2B, 2C, 2D:
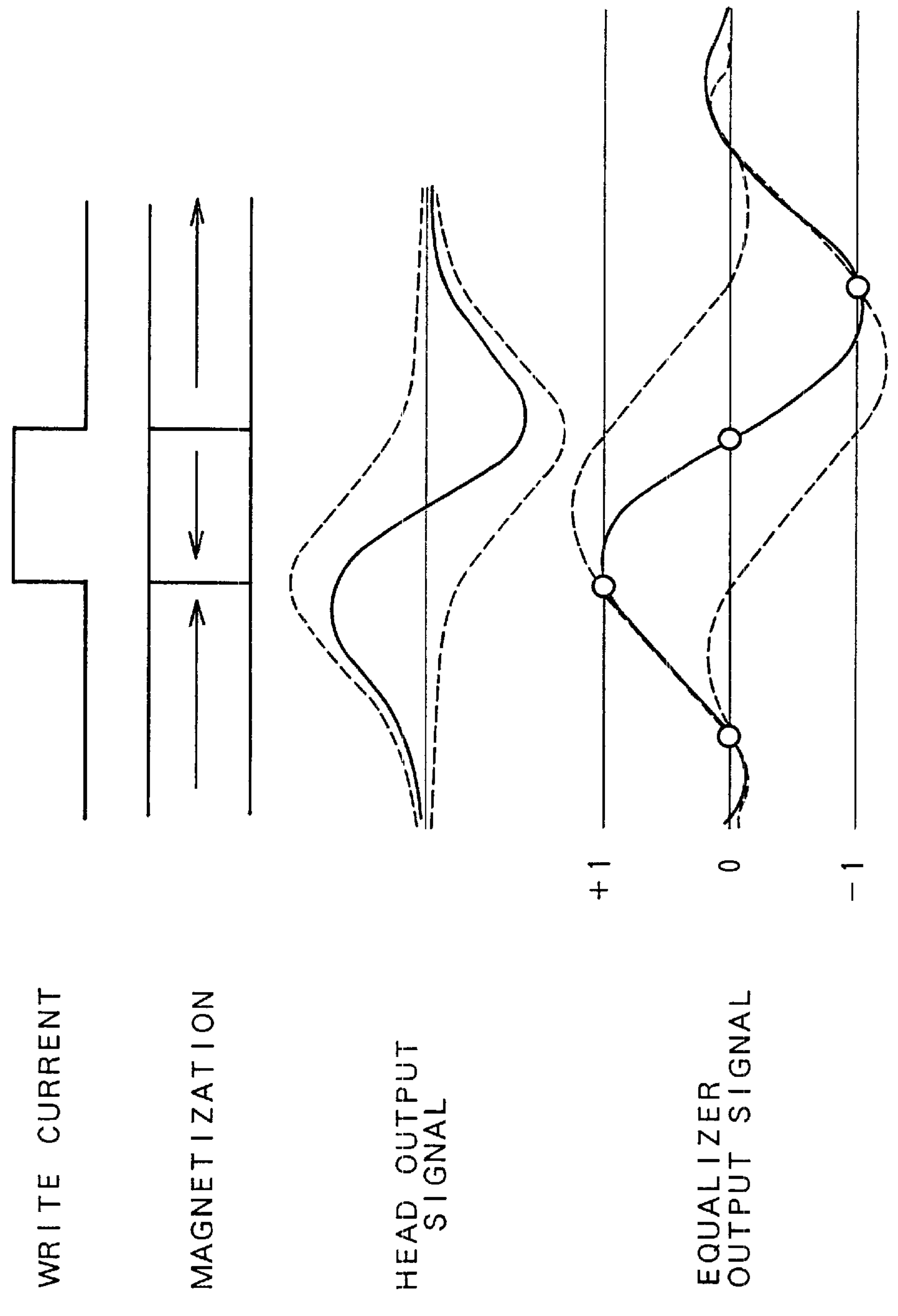
FIGS. 2A to 2D are explanatory diagrams of magnetic recording and regeneration effected by the conventional apparatus of FIG. 1.
Figures 3A, 3B, 3C:
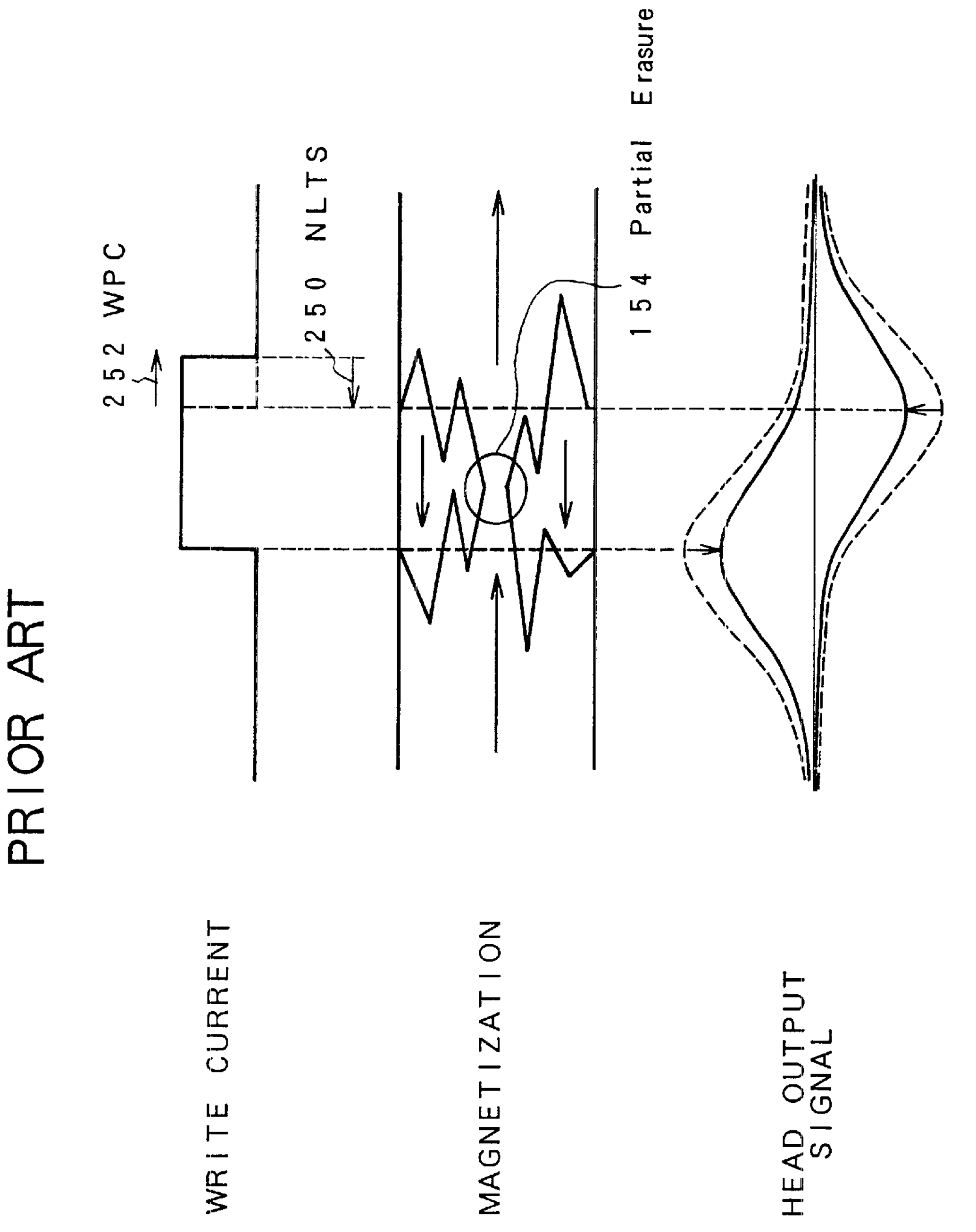
FIGS. 3A to 3C are explanatory diagram of a conventional problem occurring in the magnetic recording and regeneration of FIGS. 2A to 2D.
Figure 11:
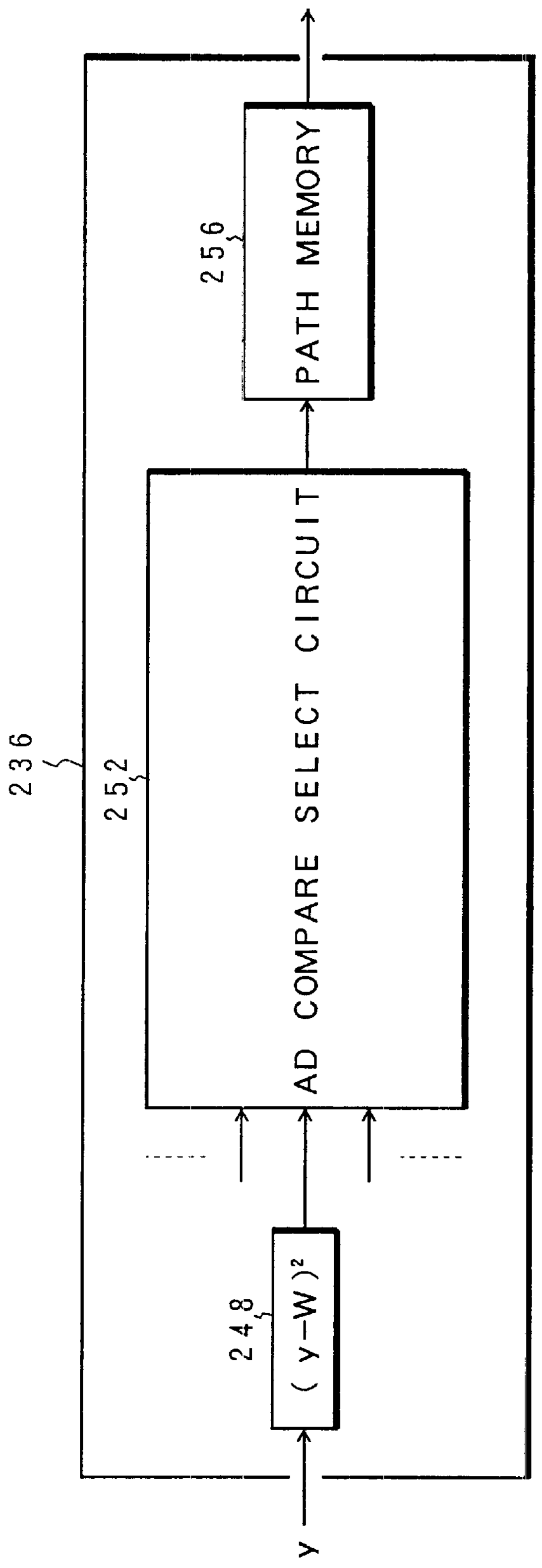
FIG. 11 is a block diagram of a conventional Viterbi detector.
Figure 12:
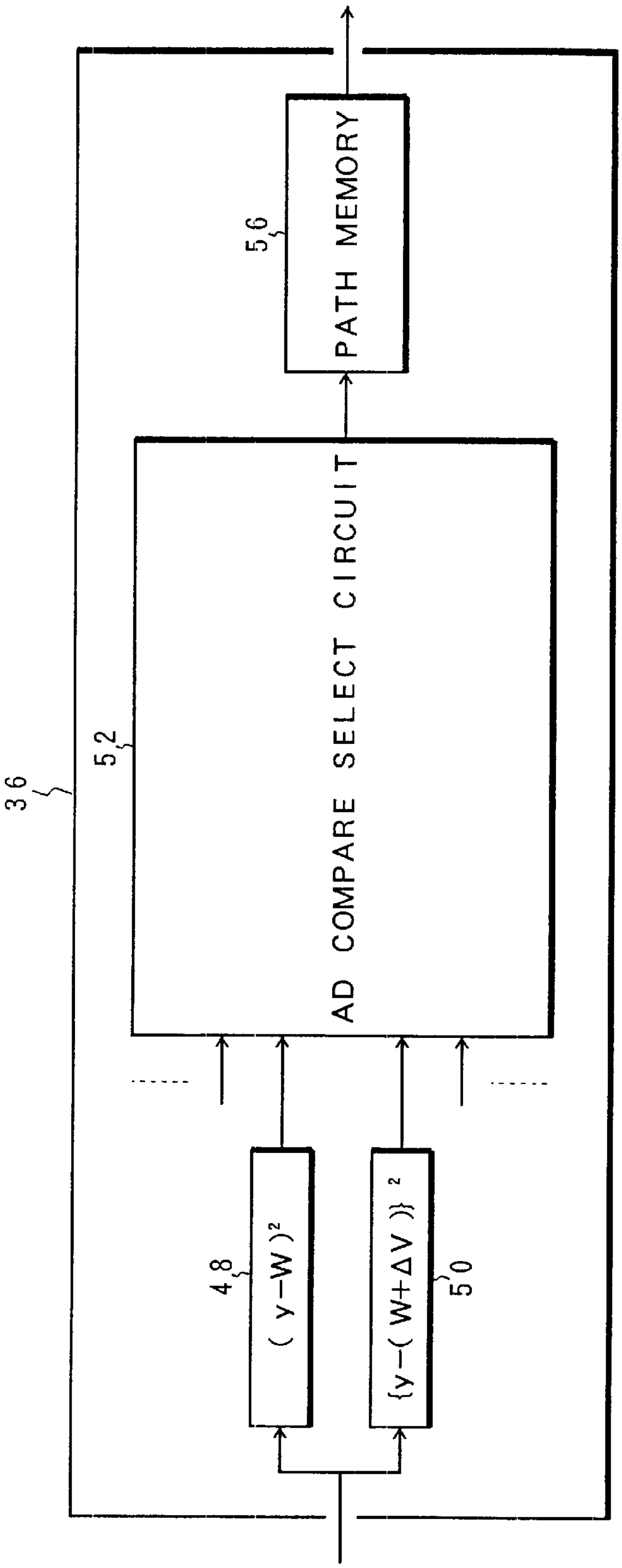
FIG. 12 is a block diagram of a Viterbi detector allowing for the errors for use in the present invention.

FIG. 11 is a schematic block diagram of a Viterbi detector 236 provided in a conventional read unit 212 shown in FIG. 1. For a plurality of record code sequences, the Viterbi detector 236 assumes noise-free equalizer output values (ideal sample values) W in the case where those code sequences have been recorded, for example three values W=+1, 0, −1 in case of PR4, and uses an error calculator 248 to figure out square error $(y-W)^2$ relative to the actual input signal y of the Viterbi detector 136, that is, the output signal y from the anterior equalizer. Then the metrics are figured out by accumulating errors by means of an ad compare select circuit (ACS circuit) 252, and assumed code sequences having a small error amount are held in a path memory 256 from which a maximum likelihood code sequence is issued.

In contrast with such conventional basic Viterbi detector 236, the present invention employs the Viterbi detector 36 which takes into consideration the errors ΔV1 to ΔV5 arising from the magnetic transition interval extension record of FIG. 10. The Viterbi detector 36 assumes equalizer output values (ideal sample values) W for previously defined record code sequences so that it varies the assumed equalizer output values W depending on whether that record code sequence is the object of extension of the magnetic transition intervals in accordance with the present invention. That is, in the case of the code sequence free from any influence of extension of the magnetic transition interval, the error calculator 48 uses the assumed values W to figure out the square error $(y-W)^2$ in the conventional manner. On the contrary, in the case of the code sequence subjected to occurrence of errors by the magnetic transition interval extension, the switchover to an error calculator 50 is carried out to use an assumed value (W+ΔV), the sum of the assumed equalizer output value W and an error ΔV, to figure out a square error $\{y-(W+\Delta V)\}^2$, thereby suppressing the influence of the errors.

Referring then to FIGS. 13A to 13C, FIGS. 14A to 14C, FIGS. 15A to 15C and FIGS. 16A to 16C, there are illustrated further embodiments of the MTR codes applied to the extension record of the minimum magnetic transition intervals of the data magnetic recording system of FIG. 5. This embodiment uses Tri-bit MTR codes in which consecutive of the magnetic transitions occurring at the minimum interval has been restricted to three or less.

Figures 13A, 13B, 13C:
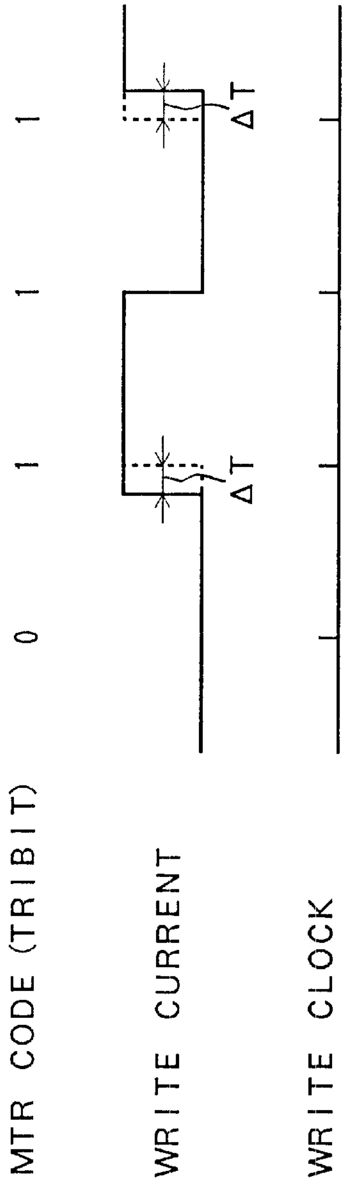
FIGS. 13A to 13C are explanatory diagrams of a recording action of a Tri-bit in accordance with the present invention, of an MTR code whose magnetic transition consecutive has been limited to three or less.
Figures 14A, 14B, 14C:
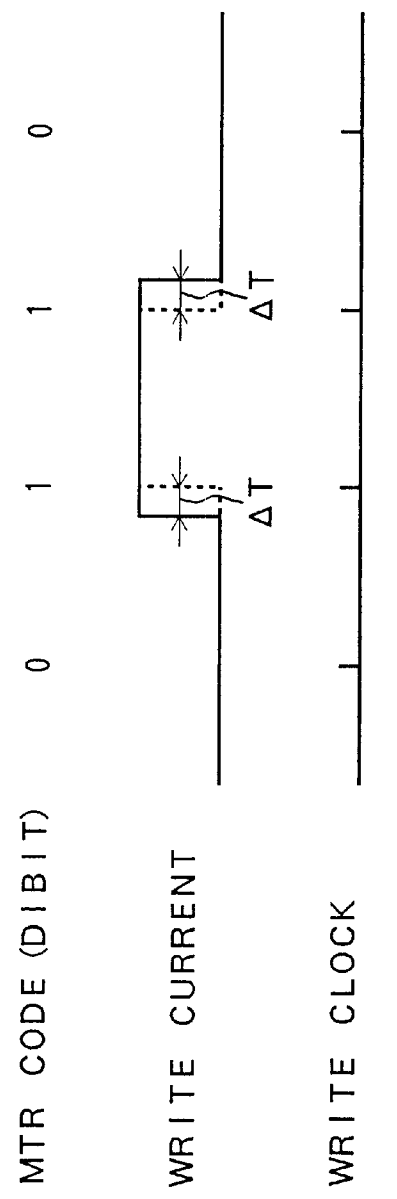
FIGS. 14A to 14C are explanatory diagrams of a recording action of a dibit, of the MTR code whose magnetic transition consecutive has been limited to three or less.

FIGS. 13A to 13C illustrate a Tri-bit MTR code "0111" having three consecutive bits 1 resulting in magnetic transition, as well as a write current and a write clock. In the event of such three consecutive magnetic transitions, The magnetic transition of the first bit 1 is recorded with a forward shift of the extension width ΔT from the original position;

The second bit 1 is recorded at its original position without performing any magnetic transition;

The magnetic transition of the third bit 1 is recorded with a backward shift of the extension width ΔT from the original position;

FIGS. 14A to 14C illustrate a Tri-bit MTR code having extended magnetic transition intervals in the case of two consecutive minimum magnetic transitions. In this event, the magnetic transition of the first bit 1 is recorded with a forward shift of the extension width ΔT from the original position, and the magnetic transition of the second bit 1 is recorded with a backward shift of extension width ΔT from the original position, in the same manner as in the case of the dibit TR code of FIGS. 6A to 6C.

Figures 15A, 15B, 15C:
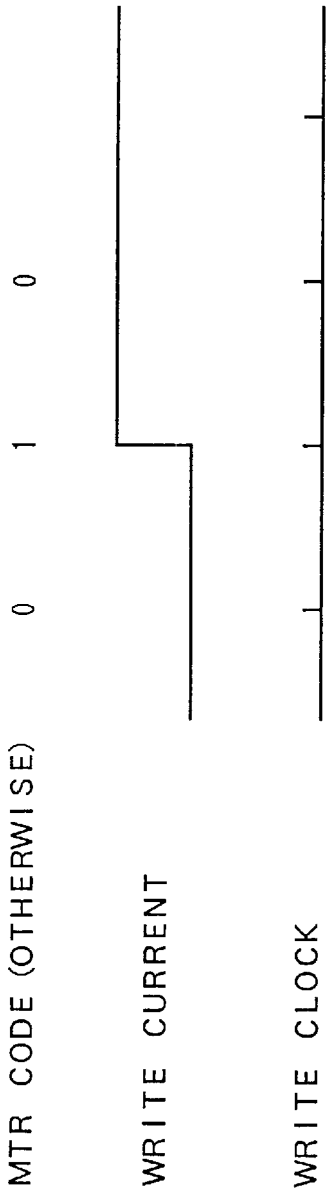
FIGS. 15A to 15C are explanatory diagrams of a recording action of bits other than the Tri-bit and dibit, of the MTR code whose magnetic transition consecutive has been limited to three or less.

FIGS. 15A to 15C illustrate a Tri-bit MTR code, e.g., "010" as well as a write current and a write clock associated therewith, which may occur other than the case of the three consecutive magnetic transitions of FIGS. 13A to 13C and the case of the two consecutive magnetic transitions of FIGS. 14A to 14C. In this case, the magnetic transition of the bit 1 is recorded at its original position without any shift in the magnetic transition position.

Figures 16A, 16B, 16C:
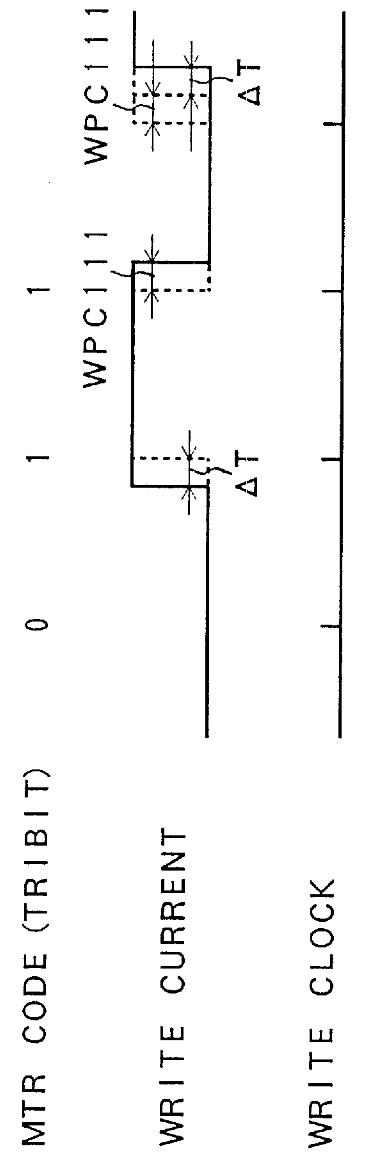
FIGS. 16A to 16C are explanatory diagrams of a recording action when a write pre-compensation has further been added to the recording action of FIGS. 13A to 13B.

FIGS. 16A to 16C illustrate the case where the write pre-compensation WPC has been performed for the correction of the non-linear transition shift NLTS in the case of three consecutive magnetic transitions of FIGS. 13A to 13C. That is, in the case of three consecutive magnetic transitions, the write pre-compensation WPC 111 delays the magnetic transition intervals backward, so that the bit 1 resulting in the second magnetic transition is recorded with a backward shift equal to the amount of write pre-compensation WPC111. With this backward shift of the second magnetic transition bit 1 equal to the amount of write pre-compensation WPC111, the third magnetic transition bit 1 is also shifted backward by the amount of write pre-compensation WPC111 in addition to the width of extension ΔT. Also, in the event of two consecutive magnetic transitions in the Tri-bit MTR code of FIGS. 14A to 14C, the second magnetic transition bit 1 may be further shifted backward by the amount of write pre-compensation WPCO11 in the same manner as in the case of the dibit MTR code of FIGS. 8A to 8C.

Figure 17A:
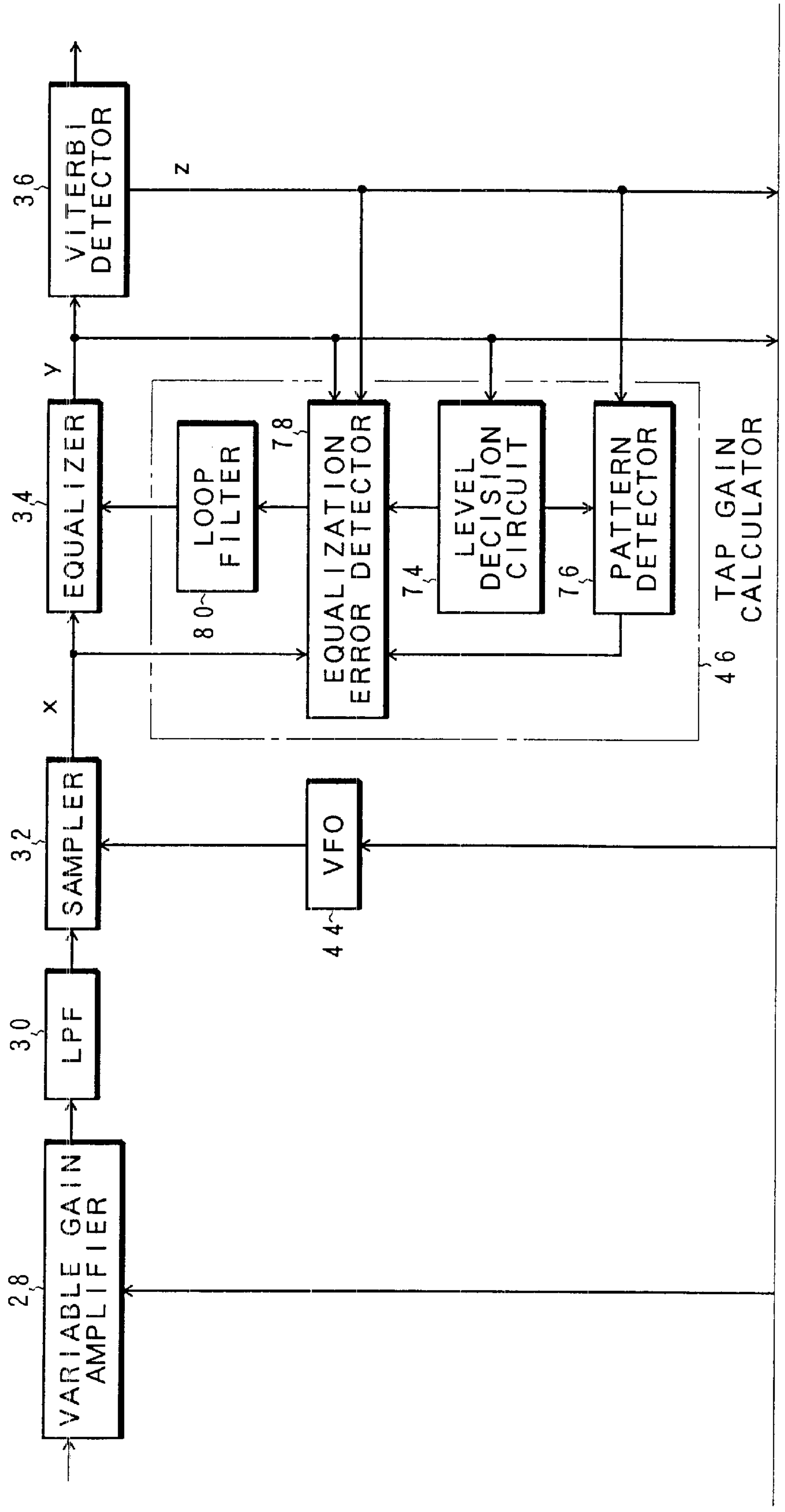
FIGS. 17A and 17B are block diagrams of a read unit equipped with a function to obviate any errors which may occur in the feedback upon the regeneration as a result of the magnetic transition interval extension record in the present invention.
Figure 17B:
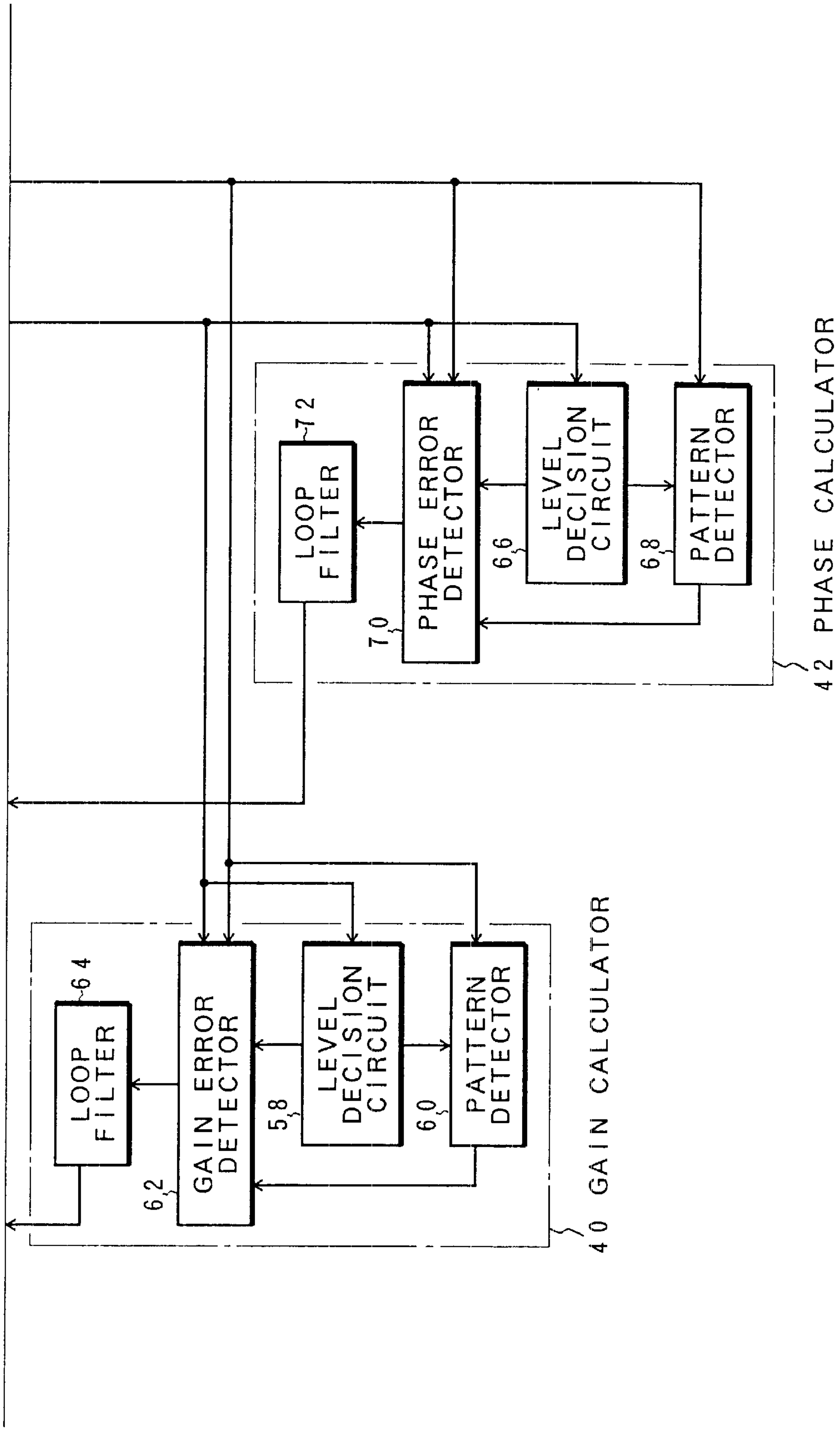

FIGS. 17A and 17B are block diagrams of a feedback system provided in the variable gain amplifier 28, the sampler 32 and the equalizer 34 of the read unit 12 of FIG. 5, the feedback system serving to prevent any influence of errors which may occur upon the regeneration by the extension record of the magnetic transition intervals. In the case of extension record of the magnetic transition intervals in accordance with the present invention, the regenerative signals may involve errors ΔV1 to ΔV5 as in FIG. 10C, with the result that the feedback loop providing a control by use of such regenerative signals may possibly be adversely affected. The circuits having such a feedback loop using the regenerative signals can be the gain calculator 40 provided as the AGC for the variable gain amplifier 28 for imparting the same amplitude to the regenerative signals, the phase calculator 42 for determining the clock phase upon the sampling of the regenerative signals, and a PLL circuit (timing recovery circuit) 45 comprised of the VFO 44, and the tap gain calculator 46 for training determining the tap gain of the equalizer 34. The gain circuit 40, the phase calculator 42 and the tap gain calculator 46 figure out the gain errors, phase errors and equalization errors by use of input signals x or output signals y and signals obtained by the level judgment of those, to thereby provide a control of the variable gain amplifier 28, the sampler 32 and the equalizer 34 by way of the loop filters adapted thereto, typically integrating circuits.

More specifically, the gain calculator 40 provided in the feedback loop for the variable gain amplifier 28 comprises a level decision circuit 58, a pattern detector 60, a gain error detector 62 and a loop filter 64. The pattern detector 60 accepts a judgement signal Z from the Viterbi detector 36, to detect whether it is the extension recorded record code sequence or not. When the pattern detector 60 detects the extension recorded record code sequence, the pattern detector 60 posts the gain error detector 62 on it, to prohibit outputs from the gain error detector 62 at that time so as to maintain the earlier gain error output state. Alternatively, instead of holding the earlier value with the prohibition of the gain error output at that time in response to the detection of the extension recorded record code sequence by the pattern detector 62, the gain error at that time may be weighted so that the thus calculated error can be restricted to a small level due to the weighting to thereby block the input of the detection error to the loop filter 64, thus suppressing any variations arising from the errors. The phase calculator 42 for deciding the clock phase of the sampler 32 comprises a level decision circuit 66, a pattern detector 68, a phase error detector 70 and a loop filter 72. When the pattern detector 68 detects an extension recorded record code sequence as a result of the comparison with the judgement signal Z from the Viterbi detector 36, the pattern detector 68 posts the phase error detector 70 on it, to stop the phase error detection output therefrom. For this reason, with respect to the regenerative pattern of the extension recorded record sequence, the loop filter 72 does not provide a phase error filter output to the VFO 44, to suppress any variations in the clock phase due to the errors. In this case as well, upon the acceptance of output by the pattern detector 68, the phase error detector 70 may impart a weight to the phase errors to thereby suppress the errors, previous to the output to the loop filter 72. Furthermore, the tap gain calculator 46 for setting by training the tap gain of the equalizer 34 comprises a level decision circuit 74, a pattern detector 76, an equalization error detector 78 and a loop filter 80. When the pattern detector 76 detects a record code sequence which has been subjected to magnetic transition interval extension record, from the judgment signal Z from the Viterbi detector 36, the pattern detector 76 stops the output from the equalization error detector 78 at that time, to stop the tap gain control of the equalizer 34 through the loop filter 80, thereby preventing any influences of errors involved in the regenerative signals. In this case as well, upon the acquisition of the output of the pattern detector 76, the output from the equalization error detector 78 is weighted in order to suppress any influences of errors arising from the extension of the magnetic transition intervals.

Description will then be made of a parameter regulation unit 14 provided for the write unit 10 and the read unit 12 of FIG. 5. The parameter regulation unit 14 monitors the error rate of the Viterbi detector 36 through the recording and regeneration using as the test pattern the dibit MTR code whose minimum magnetic transition interval consecutive has been restricted to two or less for use in the present invention, or the Tri-bit MTR code whose minimum magnetic transition interval consecutive has been restricted to three or less, and regulates for setting, so as to minimize the error rate, the amount of magnetic transition extension ΔT on the specific code sequence for use in the write pre compensation/transition width extension circuit 20 of the write unit 10 and the amplitude error ΔV to be added to the ideal sample value (expected value) in the Viterbi detector 36. The function of the parameter regulation unit 14 may be implemented by use of regulation facilities or testing facilities for various parameters provided in the final assembly steps in factories, or alternatively, it may be incorporated in the magnetic disk itself.

Figure 18:
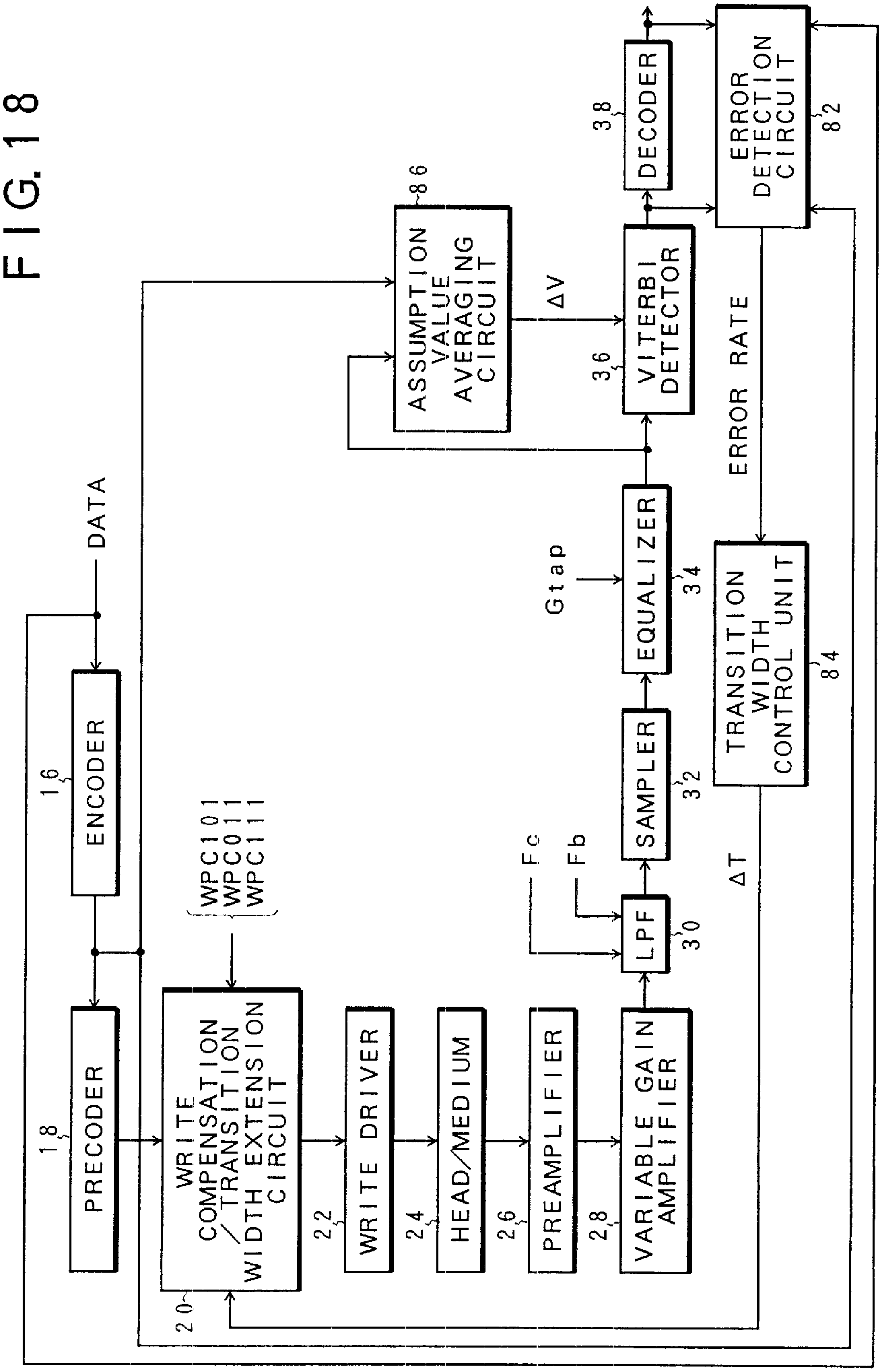
FIG. 18 is a block diagram of a parameter regulation function to regulate the magnetic transition extension width $\Delta T$ upon the write and the amplitude error $\Delta V$ in the maximum likelihood so as to minimize the regenerative error rate.

FIG. 18 is a function block diagram of an embodiment in which the parameter regulation unit 14 is used to monitor the error rate of the Viterbi detector 36 and to regulate for setting the amount of magnetic transition width extension ΔT and the amplitude error ΔV in the maximum likelihood detection so as to minimize the error rate. In order to regulate the amount of magnetic transition width extension ΔT and the amplitude error ΔV in the maximum likelihood detection, an error detection circuit 82 is provided for detecting the error rate on the basis of the output from the Viterbi detector 36 and of the output from the decoder 38. The error rate detected by the error detection circuit 82 is fed to a transition width control circuit 84 for regulating the amount of extension ΔT for use in the write pre compensation/transition width extension circuit 20 so as to minimize the error rate. An assumption value averaging circuit 86 is also provided for figuring out an error ΔV to be added to an assumption value W in the absence of noise in the Viterbi detector 36. The assumption value averaging circuit 86 accepts the output signals from the equalizer 34 as well as unrecorded data signals from the encoder 16 and averages the differences between the two to figure out the error ΔV arising from the magnetic transition interval extension record for the setting in the Viterbi detector 36. Previous to the execution of such regulations of the magnetic transition extension width ΔT and the amplitude error ΔV in the maximum likelihood detection, regulations are carried out of the amount of write pre-compensation for use in the write pre compensation/transition width extension circuit 20 on the write unit side, the cut-off frequency Fc of the lowpass filter 30 of the read unit, the amount of boost Fb, and the parameter of the tap gain Gtap of the equalizer 34. Herein, the regulation and the setting of the amount of write pre-compensation are performed so as to minimize the error rate, and the upon the regeneration the setting of the amount of write pre-compensation adapted to the respective record code sequences is carried out together with the setting of the amount of extension ΔT of the magnetic transition intervals, the aforementioned amount of write pre-compensation to be set in the write pre compensation/transition width extension circuit 20 including the amount of write pre-compensation WPC111 of the three consecutive magnetic transition bits "111" of FIGS. 13A to 13C, the amount of write pre-compensation WPC011 of the two consecutive magnetic transition bits "011" of FIGS. 14A to 14C, and the amount of write pre-compensation WPC101 of the other bits "101".

Figure 19:
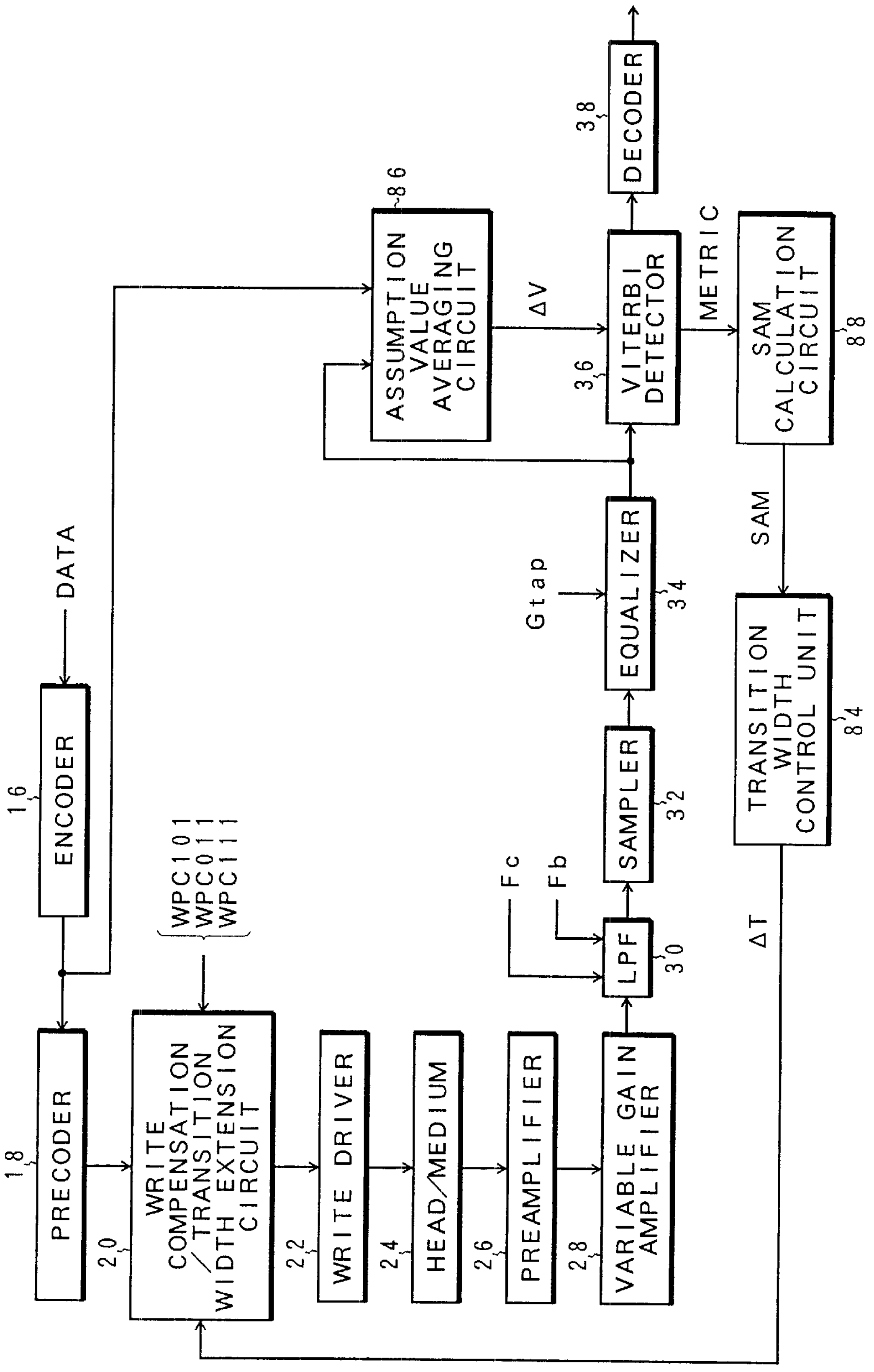
FIG. 19 is a block diagram of a parameter regulation function to regulate the magnetic transition extension width $\Delta T$ upon the write and the amplitude error $\Delta V$ in the maximum likelihood using SAM so as to minimize the regenerative error rate.

FIG. 19 illustrates another embodiment of the parameter regulation unit 14 of FIG. 5. This embodiment monitors the error rate figured out by SAM using the metrics which are cumulative values of square errors calculated in the Viterbi detector 36, and regulates for setting the magnetic transition extension width ΔT and the Viterbi detection amplitude error ΔV so as to minimize the error rate. A SAM calculation circuit 88 is provided which accepts metrics figured out by the Viterbi detector 36. The SAM calculation circuit 88 compares a difference Mn between the minimum metric M1 and the second minimum metric M2 figured out by the Viterbi detector 36 with a threshold value K including a stress of typically zero added thereto, and if $$Mn<K$$

then it performs the error count to provide the error rate as SAM output to the transition width control circuit 84. As a result of the addition of such a stress to the threshold value for judging the error from the difference between the first and second minimum metrics, the calculation of the error rate in the embodiment of FIG. 18 is more time-consuming. However, use of the SAM calculation circuit 88 allows noise-induced errors to frequently occur so that the error rate can be obtained in a brief period of time, whereby it is possible to reduce the processing time required for the regulation of the amount of magnetic transition interval extension ΔT and the amplitude error ΔV added to the sample value of the Viterbi detector, thus achieving high-speed processing. The assumption value averaging circuit 86 is the same as that of the embodiment of FIG. 18. References on the SAM include for example "A Window-Margin-Like Procedure for Evaluating PRML Channel Performance" by Tim Perkins and Zachary A. Keirn, IEEE Trans. on Magnetics, Vol. 21, No. 2, March 1995. Also, in this embodiment for monitoring the SAM using the metrics figured out by the Viterbi detector 36, the regulations are performed in advance of the amounts of write pre-compensation WPC101, WPC011 and WPC111 for use in the write pre compensation/transition width extension circuit, the cut-off frequency Fc and the amount of boost Eb for use in the lowpass filter 30 of the read unit, and the tap gain Gtap of the equalizer 34, previous to the regulations of the amount of magnetic transition interval extension ΔT and the amplitude error ΔV added to the Viterbi detection sample value.

Figure 20A:
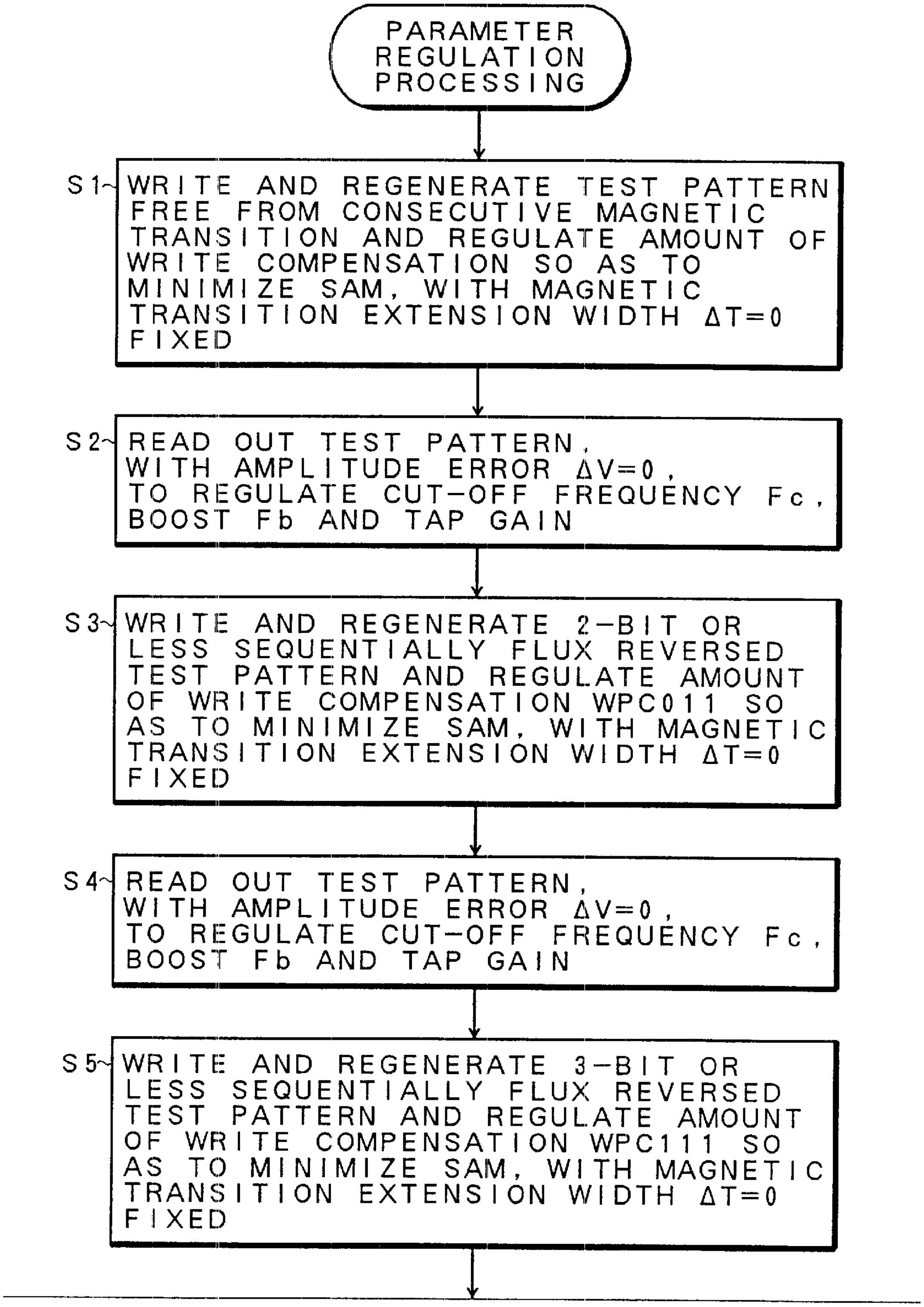
FIGS. 20A and 20B are flowcharts of parameter regulation processing of FIG. 19.
Figure 20B:
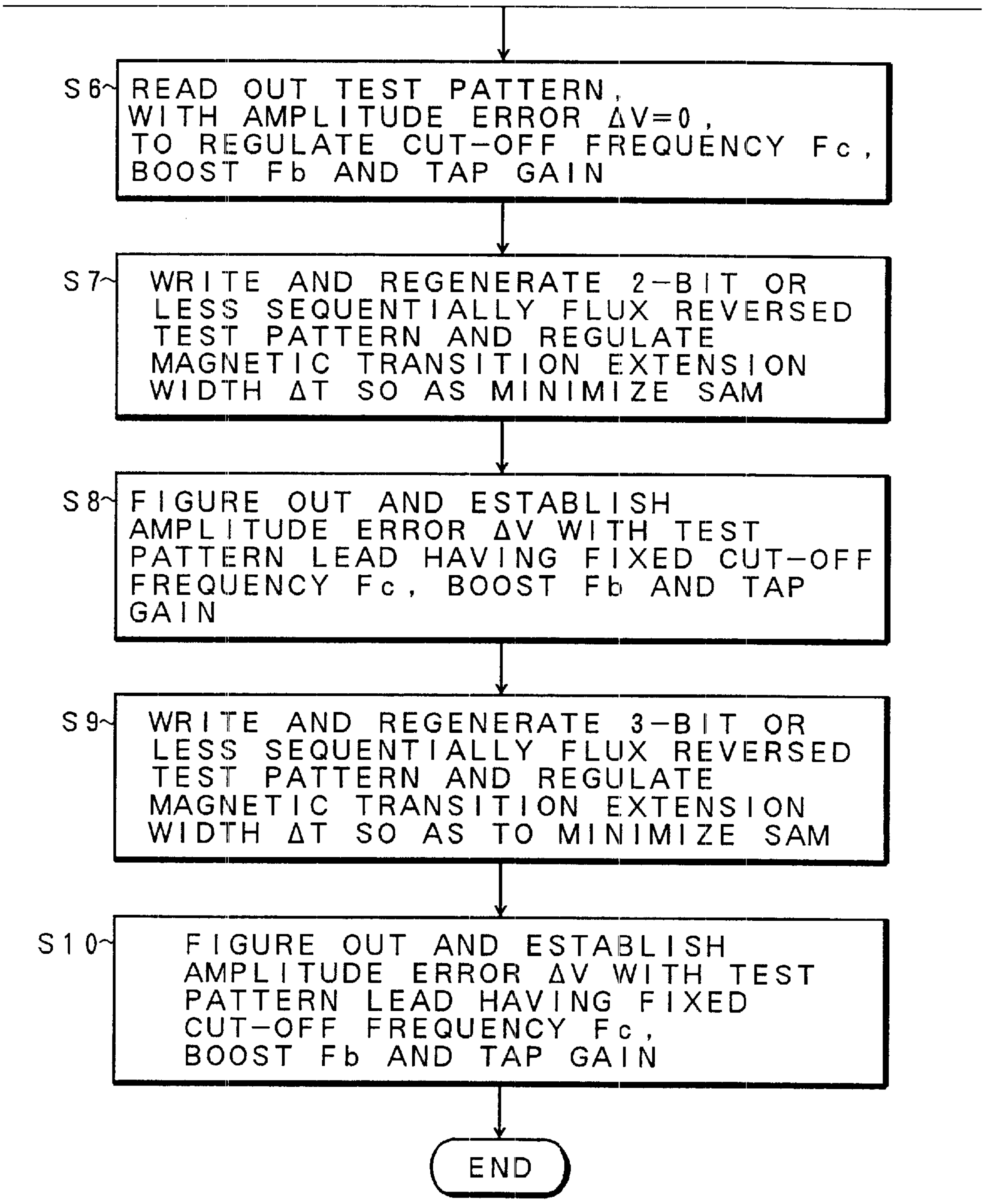

FIGS. 20A and 20B are flowcharts of the regulation processing effected by the parameter regulation unit 14 of FIG. 5 by way of example of FIG. 19. First in step S1, test patterns free from any consecutive magnetic transitions are written and reproduced, and the amount of write pre-compensation WPC101 is regulated so as to minimize SAM, with the magnetic transition extension width ΔT being fixed to zero. Then in step S2, the test patterns are read with the amplitude error ΔV=0, to regulate the cut-off frequency Fc, the amount of boost Eb and the tap gain Gtap so as to minimize the SAM. Then in step S3, a 2-bit consecutive magnetic transition test pattern, that is, a 2-bit MTR code test pattern is written for regeneration, to regulate the amount of write precompensation WPC010 so as to minimize the SAM with the magnetic transition extension width ΔT=0 fixed. Then in step S4, using the amount of write pre-compensation WPC011 the test pattern is read with the amplitude error ΔV=0, to regulate the cut-off frequency Fc, the amount of boost Eb and the tap gain Gtap so as to minimize the SAM. Then in step S5, a 3-bit consecutive magnetic transition test pattern, that is, a 3-bit MTR code test pattern is written for regeneration, to regulate the amount of write pre-compensation WPC111 so as to minimize the SAM with the magnetic transition extension width ΔT=0 fixed. Then in step S6, a test pattern is read with the amplitude error ΔV=0, to regulate the cut-off frequency Fc, the amount of boost Fb and the tap gain Gtap so as to minimize the SAM. After the completion of the regulations and settings of amount of write pre compensation, the cut-off frequency, the amount of boost and the tap gain in steps S1 to S6 in this manner, the two-bit consecutive magnetic transition test pattern is written for regeneration in step S7 to regulate the magnetic transition extension width ΔT so as to minimize the SAM. Then in step S8, the test pattern is read with the cut-off frequency Fc, the amount of boost Fb and the tap gain Gtap remaining fixed to the values regulated in step S4, to figure out and set an average value of the amplitude errors ΔV. Then in step S9, 3-bit consecutive magnetic transition test pattern is written and regenerated, to regulate and set the magnetic transition extension width ΔT so as to minimize the SAM. Finally in step S10, an average value of the amplitude errors ΔV is figured out and set through the read of the test pattern with the cut-off frequency Fc, the amount of boost Fb, the tap gain Gtap remaining fixed to the values regulated in step S6.

According to the present invention as set forth hereinabove, the extension record of the magnetic transition intervals enables the amount of stochastic distribution (medium noise) in the non-linear phenomena such as non-linear transition shift NLTS or partial magnetic dispersion PE to be suppressed as small as possible.

This will lead to a remarkably improved reliability of the regenerative data read from the medium subjected to the extension record of the magnetic transition intervals. Furthermore, by virtue of the positive extension record of the magnetic transition intervals, it is possible to reduce the problem of thermal relaxation and therefore to further improve the recording density, thereby achieving a higher performance of the data storage apparatus.

Although the above embodiments have employed by way of example the dibit MTR having two consecutive minimum interval magnetic transitions and the Tri-bit MTR code having three consecutive magnetic transitions, the consecutive number of the magnetic transitions occurring at the minimum interval may be any arbitrary number other than the two or three.

The present invention is applicable intactly to any appropriate codes other than the MTR codes as long as it is a code restricting the consecutive of the magnetic transitions occurring at the minimum intervals. Although the above embodiments have employed the hard disk drive by way of example, the magnetic transition interval extension record of the present invention is applicable intactly to any magnetic tape apparatus or to any magneto-optic recording apparatus for performing magnetic recording on the medium in the same manner. It is to be appreciated that the present invention involves any appropriate variants without impairing the objects and advantages thereof and that the numeral values indicated in the above embodiments are not intended to be limitative.

What is claimed is:

1. A data storage apparatus for magnetic recording and regeneration on a medium, said data storage apparatus comprising:

a write unit which, only in case of occurrence of a specific code sequence, records a magnetic transition interval on said medium with an extension relative to its original magnetic transition interval; and a read unit which, in a maximum likelihood detection after equalization of read signals of said medium, adds to an expected value of said maximum likelihood detection an amplitude error arising from extension record of said magnetic transition interval relative to said original magnetic transition interval.

2. The data storage apparatus according to claim 1, wherein said-write unit, upon the magnetic recording on said medium, uses a coding scheme in which restriction is imposed on the magnetic transition consecutive occurring at the minimum interval, and wherein said write unit, only in case of occurrence of a specific code sequence in said coding scheme, forms said magnetic transition interval on said medium with an extension relative to said original magnetic transition interval.

3. The data storage apparatus according to claim 1, wherein said write unit, upon the magnetic recording on said medium, uses codes whose magnetic transition consecutive occurring at the minimum interval has been restricted to two or less, and wherein said write unit, only in case of occurrence of two consecutive magnetic transitions, records a first magnetic transition with a certain forward shift from its original position and a second magnetic transition with a certain backward shift from its original position.

4. The data storage apparatus according to claim 1, wherein said write unit, upon the magnetic recording on said medium, uses codes whose magnetic transition consecutive occurring at the minimum interval has been restricted to three or less, and wherein said write unit, in case of occurrence of two consecutive magnetic transitions, records a first magnetic transition with a certain forward shift from its original position and a second magnetic transition with a certain backward shift from its original position, and wherein said write unit, in case of occurrence of three consecutive magnetic transitions, records a first magnetic transition with a certain forward shift from its original position, a second magnetic transition at its original position, and a third magnetic transition with a certain backward shift from its original position.

5. The data storage apparatus according to claim 1, wherein said read unit is provided with an equalizer for equalizing read signals of said medium into a desired signal waveform on the basis of an equalization error signal obtained from a difference between a pre-equalization signal and a post-equalization signal, and wherein if said read unit detects a specific code sequence recorded with certain shifts from its original magnetic transition positions, then said read unit does not use said equalization error signal at that time or does use said equalization error signal suppressed through a predetermined weighting.

6. The data storage apparatus according to claim 1, wherein said read unit is provided with a PLL circuit for providing a phase control of sampling clock on the basis of a phase error signal obtained from a comparison between a reference clock and a clock extracted from an equalized regenerative signal, and wherein if said read unit detects a specific code sequence recorded with certain shifts from its original magnetic transition positions, then said read unit does not use said equalization error signal at that time or does use said equalization error signal suppressed through a predetermined weighting.

7. The data storage apparatus according to claim 1, wherein said read unit is provided with an AGC circuit for allowing a regenerative signal to have a desired amplitude on the basis of an amplitude error signal obtained from a comparison between an equalized regenerative signal and said desired amplitude, and wherein if said read unit detects a specific code sequence recorded with certain shifts from its original magnetic transition positions, then said read unit does not use said amplitude error signal at that time or does use said amplitude error signal suppressed through a predetermined weighting.

8. The data storage apparatus according to claim 1, further comprising a parameter regulation unit which monitors an error rate of a maximum likelihood detector through recording and regeneration of test patterns and which regulates and sets, so as to minimize said error rate, the amounts of magnetic transition extension of a specific code sequence for use in said write unit as well as the amounts of amplitude errors added to expected values in said maximum likelihood detection.

9. The data storage apparatus according to claim 8, wherein said parameter regulation unit monitors an error rate acquired from a SAM (Sequenced Amplitude Margin) circuit by use of metric of said maximum likelihood detector, said parameter regulation unit regulating and setting each of said amounts of amplitude errors added to expected values in said maximum likelihood detection so as to minimize said error rate.

10. The data storage apparatus according to claim 9, wherein said parameter regulation unit, previous to said regulation and setting of said amounts of magnetic transition extension and said amounts of amplitude errors, makes regulations of the amount of write pre-compensation of a write pre-compensation circuit provided in said write unit, the cut-off frequency and the amount of boost of a filter provided in said read unit, and the tap gain of an equalizer.

11. The data storage apparatus according to claim 9, wherein said parameter regulation unit, after the regulation by use of a two-bit consecutive magnetic transition pattern, makes regulations of said amounts of magnetic transition extension and said amounts of amplitude errors by use of a three-bit or more consecutive magnetic transition pattern.

12. A magnetic recording method for magnetic recording and regeneration on a medium, comprising:

a recording step for, only in case of occurrence of a specific code sequence, recording a magnetic transition interval on said medium with an extension relative to its original magnetic transition interval; and a regenerating step for, in a maximum likelihood detection after equalization of read signals of said medium, adding an amplitude error arising from extension record of said magnetic transition interval relative to said original magnetic transition interval to an expected value of said maximum likelihood detection.

13. The magnetic recording method according to claim 12, wherein said recording step includes, upon the magnetic recording on said medium, using a coding scheme in which restriction is imposed on the magnetic transition consecutive occurring at the minimum interval, and wherein said recording step includes, only in case of occurrence of a specific code sequence in said coding scheme, forming said magnetic transition interval on said medium with an extension relative to said original magnetic transition interval.

14. The magnetic recording method according to claim 12, wherein said recording step includes, upon the magnetic recording on said medium, using codes whose magnetic transition consecutive occurring at the minimum interval has been restricted to two or less, and wherein said recording step includes, only in case of occurrence of two consecutive magnetic transitions, recording a first magnetic transition with a certain forward shift from its original position and a second magnetic transition with a certain backward shift from its original position.

15. The magnetic recording method according to claim 12, wherein said recording step includes, upon the magnetic recording on said medium, using codes whose magnetic transition consecutive occurring at the minimum interval has been restricted to three or less, and wherein said recording step includes, in case of occurrence of two consecutive magnetic transitions, recording a first magnetic transition with a certain forward shift from its original position and a second magnetic transition with a certain backward shift from its original position, and wherein said recording step includes, in case of occurrence of three consecutive magnetic transitions, recording a first magnetic transition with a certain forward shift from its original position, a second magnetic transition at its original position, and a third magnetic transition with a certain backward shift from its original position.

16. The magnetic recording method according to claim 12, wherein said regenerating step includes employing an equalizer for equalizing read signals of said medium into a desired signal waveform on the basis of an equalization error signal obtained from a difference between a pre-equalization signal and a post-equalization signal, and wherein said regenerating step includes, if a specific code sequence recorded with certain shifts from its original magnetic transition positions is detected, not using said equalization error signal at that time or using said equalization error signal suppressed through a predetermined weighting.

17. The magnetic recording method according to claim 12, wherein said regenerating step includes employing a PLL circuit for providing a phase control of sampling clock on the basis of a phase error signal obtained from a comparison between a reference clock and a clock extracted from an equalized regenerative signal, and wherein said regenerating step includes, if a specific code sequence recorded with certain shifts from its original magnetic transition positions is detected, not using said equalization error signal at that time or using said equalization error signal suppressed through a predetermined weighting.

18. The magnetic recording method according to claim 12, wherein said regenerating step includes employing an AGC circuit for allowing a regenerative signal to have a desired amplitude on the basis of an amplitude error signal obtained from a comparison between an equalized regenerative signal and said desired amplitude, and wherein said regenerating step includes, if a specific code sequence recorded with certain shifts from its original magnetic transition positions is detected, not using said amplitude error signal at that time or using said amplitude error signal suppressed through a predetermined weighting.

19. The magnetic recording method according to claim 12, further comprising a parameter regulation step for monitoring an error rate of a maximum likelihood detector through recording and regeneration of test patterns and for regulating and setting, so as to minimize said error rate, the amounts of magnetic transition extension of a specific code sequence for use in said recording step as well as the amounts of amplitude errors added to expected values in said maximum likelihood detection.

* * * * *